(12) United States Patent
Bednarz et al.

(10) Patent No.: US 11,368,001 B2
(45) Date of Patent: Jun. 21, 2022

(54) SYSTEM, APPARATUS, AND METHOD FOR DISTRIBUTING POWER FOR RADAR SYSTEM

(71) Applicant: Lockheed Martin Corporation, Bethesda, MD (US)

(72) Inventors: Anthony J. Bednarz, Moorestown, NJ (US); Sunder Shahani, Moorestown, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 268 days.

(21) Appl. No.: 16/855,902

(22) Filed: Apr. 22, 2020

(65) Prior Publication Data

US 2021/0336425 A1 Oct. 28, 2021

(51) Int. Cl.
*H02B 1/20* (2006.01)
*G01S 7/03* (2006.01)

(52) U.S. Cl.
CPC ............... *H02B 1/20* (2013.01); *G01S 7/032* (2013.01)

(58) Field of Classification Search
CPC .................................. G01S 7/032; H02B 1/20
USPC ................... 342/368, 175, 125, 145
See application file for complete search history.

(56) References Cited

U.S. PATENT DOCUMENTS

| 4,401,843 A | 8/1983 | Harper et al. |
| 5,412,414 A | 5/1995 | Ast et al. |
| 5,945,941 A | 8/1999 | Rich, III et al. |
| 6,856,283 B2 | 2/2005 | Jacobson et al. |
| 7,704,083 B1 | 4/2010 | Cheyne et al. |
| 2008/0169973 A1* | 7/2008 | Pluymers ................. H01Q 1/02 342/368 |

FOREIGN PATENT DOCUMENTS

| CN | 201853820 U | 6/2011 |
| EP | 0539353 A2 | 4/1993 |

OTHER PUBLICATIONS

International Search Report and Written Opinion for Application No. PCT/US2020/064013 dated Mar. 26, 2021 (14 pages).

* cited by examiner

*Primary Examiner* — Bo Fan
(74) *Attorney, Agent, or Firm* — Michael Best & Friedrich LLP

(57) ABSTRACT

Systems, apparatus, and related methods for distributing power associated with radars are disclosed. A disclosed bus bar assembly for a radar power distribution system includes a first vertical bus and first horizontal buses electrically coupled to the first vertical bus. The bus bar assembly also includes a second vertical bus and second horizontal buses electrically coupled to the second vertical bus. The bus bar assembly also includes first blind mate connectors coupled to the first horizontal buses whereby each of the first horizontal buses includes a pair of the first blind mate connectors configured to removably connect to an LRU. The bus bar assembly also includes second blind mate connectors coupled to the second horizontal busses whereby each of the second horizontal buses includes a pair of the second blind mate connectors configured to removably connect to an LRU.

20 Claims, 18 Drawing Sheets

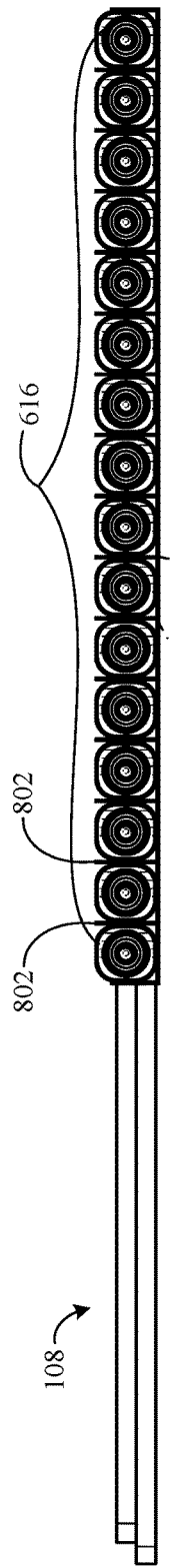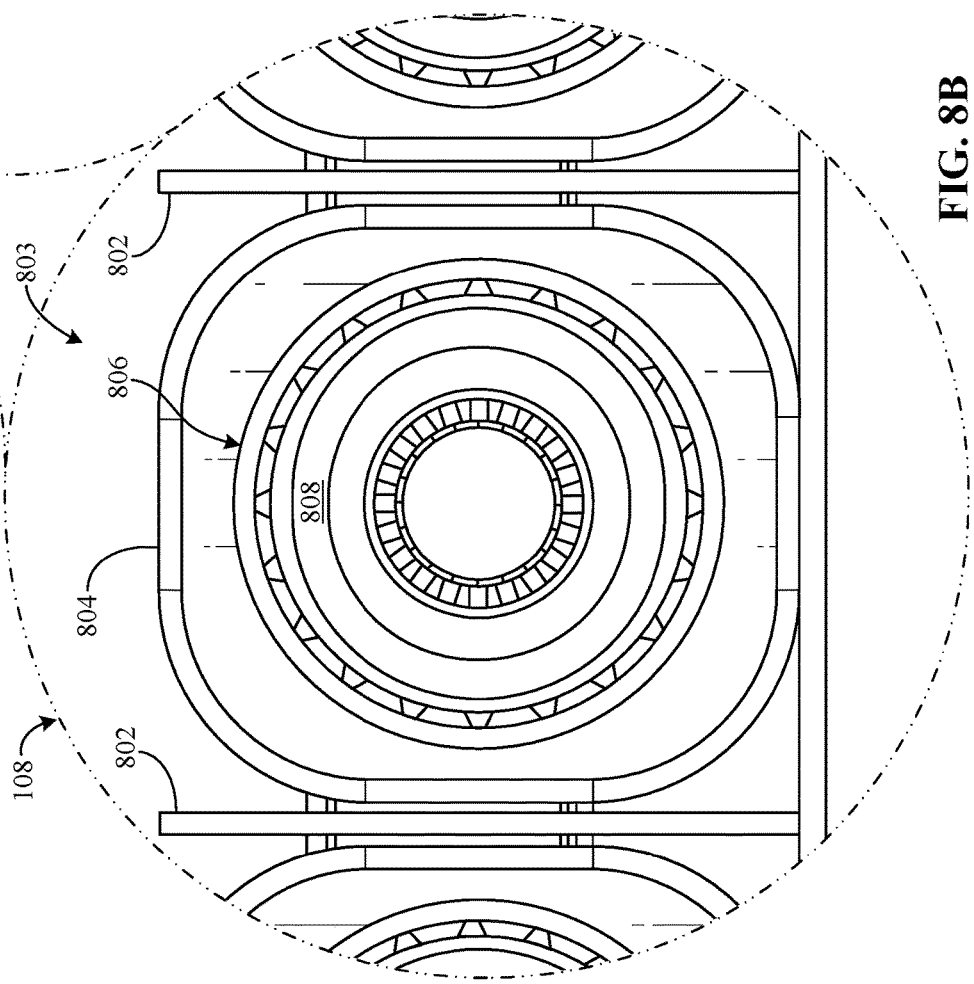
FIG. 8A
FIG. 8B

SYSTEM, APPARATUS, AND METHOD FOR DISTRIBUTING POWER FOR RADAR SYSTEM

SUMMARY

Embodiments of the disclosed subject matter involve distributing power associated with radars. More particularly, embodiments of the disclosed subject matter involve systems, devices, and methods to distribute power to line-replaceable units (LRUs) using a high-current compact bus bar solution.

According to one or more embodiments of the disclosed subject matter, a bus bar assembly for a radar power distribution system can be provided or implemented. The bus bar assembly can comprise a first conductive plate subassembly having a vertical orientation in a first vertical plane; a second conductive plate subassembly having the vertical orientation in a second vertical plane different from the first vertical plane, the second conductive plate subassembly being separated in a horizontal direction from the first conductive plate subassembly; a first horizontal bus having a horizontal orientation; and a second horizontal bus having the horizontal orientation and provided at a same height as the first horizontal bus, wherein the first horizontal bus forms, in part, a first blind mate interface to removably connect a first set of line-replaceable units (LRUs) to supply electrical power from the first conductive plate subassembly to the first set of LRUs via the first horizontal bus, wherein the second horizontal bus forms, in part, a second blind mate interface to removably connect a second set of LRUs to supply electrical power from the second conductive plate subassembly to the second set of LRUs via the second horizontal bus, wherein the first conductive plate subassembly is electrically connected to the first horizontal bus and configured to provide a first current to the first horizontal bus, and wherein the second conductive plate subassembly is electrically connected to the second horizontal bus and configured to provide a second current to the second horizontal bus, the second current being less than the first current.

Additionally, one or more embodiments of the disclosed subject matter can provide or implement a radar power distribution system. The radar power distribution system can comprise a chassis; a first laminated vertical bus supported by the chassis and having a vertical orientation in a first vertical plane; a second laminated vertical bus supported by the chassis and separated from the first laminated vertical bus, the second laminated vertical bus having the vertical orientation in a second vertical plane different from the first vertical plane; a plurality of first horizontal buses supported by the chassis and having a horizontal orientation, the first horizontal buses being laminated and spaced from each other vertically; and a plurality of second horizontal buses supported by the chassis and having a horizontal orientation, the second horizontal buses being non-laminated and spaced from each other vertically, wherein the second horizontal buses are horizontally aligned with respective ones of the first horizontal buses, wherein the first and second horizontal buses form, at least in part, blind mate interfaces to removably connect a plurality of line-replaceable units (LRUs) to distribute electrical power from the first and second laminated vertical buses to the LRUs via the first and second horizontal buses, wherein the first laminated vertical bus is configured to provide a first voltage to the first horizontal buses, and wherein the second laminated vertical bus is configured to provide a second voltage less than the first voltage to the second horizontal buses.

One or more embodiments of the disclosed subject matter can also implement a method comprising providing a first laminated vertical bus having a vertical orientation in a first vertical plane; providing a second laminated vertical bus separated from the first laminated vertical bus and having the vertical orientation in a second vertical plane different from the first vertical plane; providing at least one first horizontal bus having a horizontal orientation; and providing at least one second horizontal bus having a horizontal orientation, wherein the at least one second horizontal bus is horizontally aligned with respective ones of the at least one first horizontal bus, wherein the at least one first and second horizontal buses form, at least in part, blind mate interfaces to removably connect a plurality of line-replaceable units (LRUs) to distribute electrical power from the first and second laminated vertical buses to the LRUs via the at least one first and second horizontal buses, wherein the first laminated vertical bus is electrically connected to the at least one first horizontal bus, wherein the second laminated vertical bus is electrically connected to the at least one second horizontal bus, wherein the first laminated vertical bus is configured to provide a first voltage to the at least one first horizontal bus, and wherein the second laminated vertical bus is configured to provide a second voltage less than the first voltage to the at least one second horizontal bus.

Embodiments can also include methods of providing, making, and/or using apparatuses and systems, or portions thereof, according to one or more embodiments of the disclosed subject matter.

The preceding summary is to provide an understanding of some aspects of the disclosure. As will be appreciated, other embodiments of the disclosure are possible utilizing, alone or in combination, one or more of the features set forth above or described in detail below. Also, while the disclosure is presented in terms of exemplary embodiments, it should be appreciated that individual aspects of the disclosure can be separately claimed.

BRIEF DESCRIPTION OF THE DRAWINGS

The accompanying drawings, which are incorporated in and constitute a part of the specification, are illustrative of one or more embodiments of the disclosed subject matter, and, together with the description, explain various embodiments of the disclosed subject matter. Further, the accompanying drawings have not necessarily been drawn to scale, and any values or dimensions in the accompanying drawings are for illustration purposes only and may or may not represent actual or preferred values or dimensions. Where applicable, some or all select features may not be illustrated to assist in the description and understanding of underlying features.

FIG. 8A is a side view of the first vertical bus of FIG. 6.

FIG. 8B is an enlarged partial-view of the first vertical bus of FIG. 8A.

DETAILED DESCRIPTION

Figure 1A:
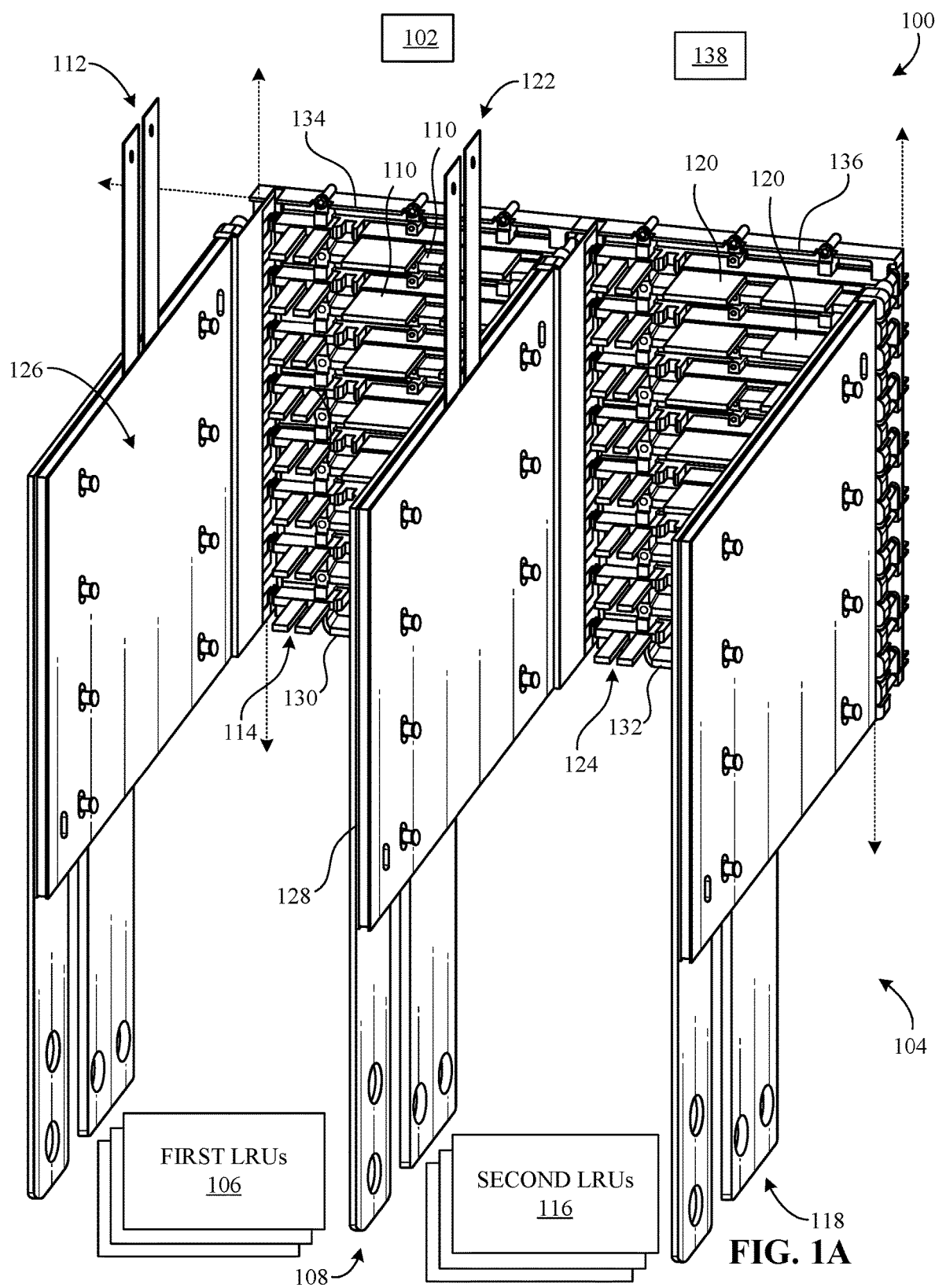
FIG. 1A is a rear overhead perspective view of a radar power distribution system (which may be interpreted as a portion thereof) according to one or more embodiments of the disclosed subject matter.

The description set forth below in connection with the appended drawings is intended as a description of various embodiments of the described subject matter and is not necessarily intended to represent the only embodiment(s). In certain instances, the description includes specific details for the purpose of providing an understanding of the described subject matter. However, it will be apparent to those skilled in the art that embodiments may be practiced without these specific details. In some instances, structures and components may be shown in block diagram form in order to avoid obscuring the concepts of the described subject matter. Wherever possible, the same reference numbers will be used throughout the drawings to refer to the same or the like parts.

Any reference in the specification to "one embodiment" or "an embodiment" means that a particular feature, structure, characteristic, operation, or function described in connection with an embodiment is included in at least one embodiment. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments, and it is intended that embodiments of the described subject matter can and do cover modifications and variations of the described embodiments.

It must also be noted that, as used in the specification, appended claims and abstract, the singular forms "a," "an," and "the" include plural referents unless the context clearly dictates otherwise. That is, unless clearly specified otherwise, as used herein the words "a" and "an" and the like carry the meaning of "one or more" or "at least one." The phrases "at least one," "one or more," "or," and "and/or" are open-ended expressions that can be both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" can mean A alone, B alone, C alone, A and B together, A and C together, B and C together, or A, B and C together. It is also to be noted that the terms "comprising," "including," and "having" can be used interchangeably.

It is to be understood that terms such as "left," "right," "top," "bottom," "front," "rear," "side," "height," "length," "width," "upper," "lower," "interior," "exterior," "inner," "outer," and the like that may be used herein, merely describe points of reference and do not necessarily limit embodiments of the described subject matter to any particular orientation or configuration. Furthermore, terms such as "first," "second," "third," etc. merely identify one of a number of portions, components, points of reference, operations and/or functions as described herein, and likewise do not necessarily limit embodiments of the described subject matter to any particular configuration or orientation.

Capacity and packaging requirements are often factors to consider when designing a part of a power distribution system for a radar, such as a bus bar mechanism configured to supply power to line-replaceable units (LRUs) associated with radar functionality and processing. In certain radar applications (e.g., naval applications), the bus bar mechanism may need to fit in a relatively small space. Blind mate connections are often used for the bus bar mechanism to enable a user to easily install or uninstall an LRU in such a space-constrained environment. Additionally, in such radar applications, the bus bar mechanism may need to have particular connections between bus bars of the bus bar mechanism such that the bus bar mechanism can supply a relatively high, continuous electric current to each LRU while maintaining a relatively small space envelope.

Embodiments of the disclosed subject matter involve systems, devices, and methods to distribute power to LRUs using a current-specific (e.g., high-current) compact bus bar solution. Bus bar assemblies according to embodiments of the disclosed subject matter may be referred to as high-current compact bus bar assemblies. A bus bar assembly for a radar power distribution system according to one or more embodiments of the disclosed subject matter can include a first vertical bus (e.g., a laminated bus bar) and a second vertical bus (e.g., a laminated bus bar), each of which is associated with providing a different voltage, where the first and second vertical buses can be spaced from each other horizontally. The first vertical bus can be configured to be supported by a first radar support structure, and the second vertical bus can be configured to be supported by the first radar support structure or a second radar support structure spaced from the first radar support structure. In embodiments where the first and second vertical buses are supported by the same radar support structure, the first and second vertical buses can be coupled together (e.g., via bolts). In some embodiments, the first vertical bus can have a higher current capacity relative to the second vertical bus.

Accordingly, in such embodiments, the first vertical bus can be larger (e.g., wider) than the second vertical bus and/or can have conductive layers that are thicker relative to conductive layers of the second vertical bus.

The disclosed bus bar assembly can also include a first horizontal bus (e.g., a laminated bus bar) and a second horizontal bus (e.g., a non-laminated molded bus bar or a laminated bus bar). Each of the first and second horizontal buses can be configured to fit within a relatively small space and within a support structure, along with RF connectors, as the support structure (or multiple support structures as the case may be) can be positioned relative to corresponding one or more apertures and associated RF emitting components. In particular, the first vertical bus can be configured to mate with the first horizontal bus, for example, via a first connection interface (e.g., a pin and socket interface) according to one or more embodiments of the disclosed subject matter. Further, the second vertical bus can be configured to mate with the second horizontal bus, for example, via a second connection interface (e.g., a fastener interface) according to one or more embodiments of the disclosed subject matter. In particular, the first vertical bus and the first horizontal bus, together, can be configured to transmit electricity at the first voltage from an electrical power source to a first LRU of a first set of LRUs. The second vertical bus and the second horizontal bus, together, can be configured to transmit electricity at the second voltage from an electrical power source to the first LRU (i.e., the same LRU) or to a second LRU of a second set of LRUs entirely different from the LRUs of the first set of LRUs, depending upon whether the second vertical bus is part of the same laminated structure as the first vertical bus.

In some embodiments, an example blind mate interface can be provided to enable a user to easily connect one or more of the LRUs to the bus bar assembly and/or disconnect one or more of the LRUs from the bus bar assembly in a blind mate manner. In such examples, the disclosed blind mate interface can include blind mate connectors (e.g., tabs) coupled to the respective first and second horizontal buses, which can allow for blind mating with an LRU power connector. For example, the blind mate interface can include a primary supply tab and a primary return tab (i.e., a first pair of the blind mate connectors) positioned on the first horizontal bus such that the primary supply tab and the primary return tab are adjacent each other. Further, the blind mate interface can also include an auxiliary supply tab and an auxiliary return tab (i.e., a second pair of the blind mate connectors) positioned on the second horizontal bus such that the auxiliary supply tab and the auxiliary return tab are adjacent each other. In particular, the primary supply tab and the primary return tab can be insertable in a portion of the first one of the LRUs, and the auxiliary supply tab and the auxiliary return tab can be insertable in a portion of the first one of the LRUs or a different one of the LRUs. In this manner, the blind mate interface can removably connect an LRU to the first horizontal bus and/or the second horizontal bus. As a result, such blind mate connectors of the blind mate interface can enable the LRU(s) to receive electrical power from the bus bar assembly during radar operation.

In some embodiments, the bus bar assembly can be scalable and/or expandable to power other LRUs in a similar manner. For example, the bus bar assembly can include multiple first horizontal buses mated (e.g., via the disclosed first connection interface) with the first vertical bus and distributed at least partially along a side of the first vertical bus. In such examples, the first horizontal buses can be connected to the first vertical bus in parallel such that the first vertical bus provides the first voltage to each of the first horizontal buses. Additionally or alternatively, the bus bar assembly can include multiple second horizontal buses mated (e.g., via the disclosed second connection interface) with the second vertical bus and distributed at least partially along a side of the second vertical bus. In such examples, the second horizontal buses can be connected to the second vertical bus in parallel such that the second vertical bus provides the second voltage to each of the second horizontal buses. Additionally or alternatively, to scale the bus bar assembly, the bus bar assembly can be implemented using one or more other pairs of vertical buses similar to the first and second vertical buses, as discussed in greater detail below. Moreover, the vertical buses can be scaled to supply a greater number of horizontal buses, depending upon current limitations, for instance.

Further, in such embodiments, the first connection interface according to embodiments of the disclosed subject matter can facilitate providing a vertical-to-horizontal configuration of the first vertical bus and the first horizontal buses in which each of the first horizontal buses is substantially perpendicular (including perpendicular) relative to the first vertical bus. Similarly, the disclosed second connection interface according to embodiments of the disclosed subject matter can facilitate providing a vertical-to-horizontal configuration of the second vertical bus and the second horizontal buses in which each of the second horizontal buses is substantially perpendicular (including perpendicular) relative to the second vertical bus. Such vertical-to-horizontal configurations of the buses can reduce a space envelope associated with the disclosed bus bar assembly. In particular, the disclosed blind mate interface can be configured to removably connect each of the LRUs to a corresponding pair of the first and second horizontal buses. Thus, the disclosed bus bar assembly can facilitate delivering two different and/or separate input voltages, for instance, at a relatively high current, to a scalable number of LRUs via blind mate connections. Embodiments of the disclosed subject matter are not limited to two voltages or two currents, and may supply more than two voltages or currents depending upon the number of layers for the buses and number of tabs.

Turning to the figures, FIG. 1A is a front overhead perspective view of a radar power distribution system (which may be interpreted as a portion thereof) 100 according to one or more embodiments of the disclosed subject matter.

According to the illustrated example of FIG. 1A, the radar power distribution system 100 can include an electrical power source (e.g., a generator) 102 (shown diagrammatically) and a bus bar assembly 104 that can be configured to receive electrical power from the electrical power source 102 and distribute the electrical power to first one or more LRUs 106 (shown diagrammatically) associated with radar functionality and processing. For example, when the first LRUs 106 are installed on the bus bar assembly 104, the bus bar assembly 104 of FIG. 1A can transmit at least a portion of the electrical power from the power source 102 to each of the first LRUs 106.

The bus bar assembly 104 of FIG. 1A can include a first vertical bus 108 (e.g., a laminated bus bar having a relatively high current-carrying capacity) and one or more first horizontal buses 110 (e.g., laminated bus bars) associated with the first vertical bus 108. In some embodiments, the bus bar assembly 104 can include eight of the first horizontal buses 110. As shown in FIG. 1A, the first horizontal buses 110 can positioned at or proximate a side of the first vertical bus 108 and distributed at least partially along a length of the side.

When the first LRUs 106 are installed on the bus bar assembly 104, each of the first horizontal buses 110 can be connected between the first vertical bus 108 and a respective one of the first LRUs 106 to provide at least a portion of the electrical power to the respective one of the first LRUs 106.

Figure 1B:
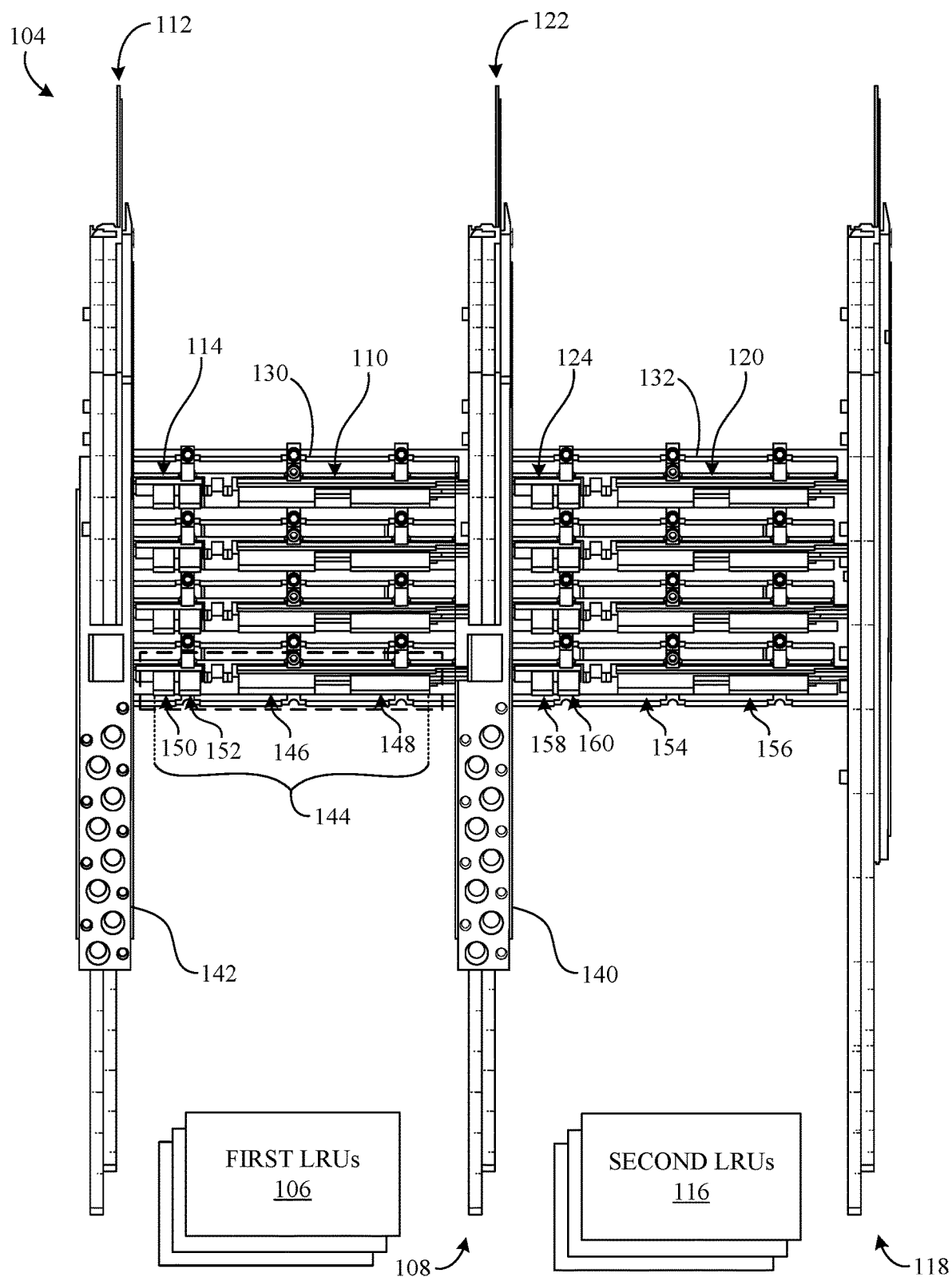
FIG. 1B is a rear elevational view of the radar power distribution system of FIG. 1A (which may be interpreted as a portion thereof) according to one or more embodiments of the disclosed subject matter.

The bus bar assembly 104 of FIG. 1A can also include a second vertical bus 112 (e.g., a laminated bus bar having a relatively low current carrying capacity) and second horizontal buses 114 (e.g., non-laminated machine-molded bus bars) that are associated with the second vertical bus 112. As shown in FIG. 1B, the first horizontal buses 110 can be aligned in a horizontal direction with or at a same height as respective ones of the second horizontal buses 114. The second vertical bus 112 of FIG. 1A can be separated from the first vertical bus 108, for instance, horizontally as shown in FIG. 1B, by a space 126 for the first LRUs 106. In some embodiments, the bus bar assembly 104 can include eight of the second horizontal buses 114, though embodiments of the disclosed subject matter are not limited to eight second horizontal buses 114. Optionally, the number of second horizontal buses 114 can match the number of first horizontal buses 110.

As shown in FIG. 1A, the second horizontal buses 114 can be positioned at or proximate a side of the second vertical bus 112 and distributed at least partially along a length of the side. When the first LRUs 106 are installed on the bus bar assembly 104, each of the second horizontal buses 114 can be connected between the second vertical bus 112 and a respective one of the first LRUs 106 to provide at least a portion of the electrical power to the respective one of the first LRUs 106. As such, in some embodiments, each of the first LRUs 106 can be connectable (e.g., removably connectable) to one of the first horizontal buses 110 and one of the second horizontal buses 114 (i.e., a pair of first and second horizontal buses 110, 114) to receive at least a portion of the electrical power therefrom.

The bus bar assembly 104 of FIG. 1A can be configured for use with eight of the first LRUs 106 between first vertical bus 108 and second vertical bus 112. However, embodiments of the disclosed subject matter are not limited to eight first LRUs 106, and can include more than eight first LRUs 106 or fewer than eight LRUs 106.

In certain radar applications, each of the first LRUs 106 can be configured to receive a first voltage and a second voltage that is separate from the first voltage during radar operation to power a circuit card thereon. According to the illustrated example of FIG. 1A, the first vertical bus 108 and the first horizontal buses 110, together, can be configured to transmit electricity at the first voltage from the power source 102 to one or more (e.g., all) of the first LRUs 106. Further, the second vertical bus 112 and the second horizontal buses 114, together, can be configured to transmit electricity at the second voltage from the power source 102 to one or more (e.g., all) of the first LRUs 106. As such, the first and second vertical buses 108, 112 (i.e., a first pair of vertical buses 108, 112), along with the associated pairs of horizontal buses 110, 114, can facilitate providing two different voltages to the first LRUs 106.

As an example, the first voltage, which can be supplied by the first vertical bus 108 and each of the first horizontal buses 110, can be greater than the second voltage, which can be supplied by the second vertical bus 112 and the second horizontal buses 114. As a non-limiting example, the first voltage may be 200-270 V and the second voltage can be 28-60 V.

Additionally or alternatively, the first vertical bus 108 and the first horizontal buses 110 can handle current of a first value, and the second vertical bus 112 and the second horizontal buses 114 can handle current of a second value. The first value may be greater than the second value. For instance, the first current value can be 120 A (e.g., per first LRU 106) and the second current can be 40 A (e.g., per first LRU 106). Thus, in some embodiments, each of the first horizontal buses 110 can have a higher current carrying capacity relative to any one of the second horizontal buses 114. Optionally, the current of the first vertical bus 108 can be greater than the current in each of the first horizontal buses 110 (e.g., 120 A). Further, optionally, the current in the first horizontal buses 110 can still be greater than the current of the second vertical bus 112, which, itself, can be greater than the current in each of the second horizontal buses 114.

The first vertical bus 108 and the second vertical bus 112 can be sized, shaped, structured, and/or otherwise configured to provide the first voltage and/or the first current and the second voltage and/or second current, respectively. According to one or more embodiments, the vertical bus 108, 112 with the higher voltage or current may be referred to as a primary vertical bus and the other vertical bus can be referred to as a secondary or auxiliary vertical bus. Similarly, first horizontal bus 110 and the second horizontal bus 114 can be sized, shaped, structured, and/or otherwise configured to provide the first voltage and/or the first current and the second voltage and/or second current, respectively. According to one or more embodiments, the horizontal bus 108, 112 with the higher voltage or current may be referred to as a primary horizontal bus and the other horizontal bus can be referred to as a secondary or auxiliary horizontal bus.

According to one or more disclosed embodiments, the bus bar assembly 104 of FIG. 1A can distribute the electrical power to the first LRUs 106 via at least the first pair of vertical buses 108, 112 and associated pairs of horizontal buses 110, 114. In some embodiments, the bus bar assembly 104 can be scalable and/or expandable to similarly distribute electrical power to other LRUs. For example, the bus bar assembly 104 can be scaled and/or expanded by including one or more additional pairs of vertical buses and associated pairs of horizontal buses. Accordingly, though aspects have been depicted in connection with the first pair of vertical buses 108, 112 and the associated pairs of horizontal buses 110, 114, in some embodiments, such aspects likewise apply to the other pair(s) of vertical buses and associated pairs of horizontal buses. In such embodiments, the bus bar assembly 104 can be structured and/or configured to receive the electrical power from the power source 102 and distribute the electrical power to at least second LRUs 116 different from the first LRUs 106. For example, when the second LRUs 116 are installed on the bus bar assembly 104, the bus bar assembly 104 of FIG. 1A can transmit at least a portion of the electrical power from the power source 102 to each of the second LRUs 116.

In such embodiments, the bus bar assembly 104 can also include a third vertical bus 118 (e.g., a laminated bus bar having a relatively high current carrying capacity) and third horizontal buses 120 (e.g., laminated bus bars) associated with the third vertical bus 118.

The third vertical bus 118 can be separated from the first vertical bus 108 and the second vertical bus 112. The third vertical bus 118 may be substantially similar or the same relative to the first vertical bus 108. Further, the third horizontal buses 120 may be substantially similar or the same relative to the first horizontal buses 110. When the second LRUs 116 are installed on the bus bar assembly 104, each of the third horizontal buses 120 can be connected between the third vertical bus 118 and a respective one of the second LRUs 116 to provide at least a portion of the electrical power to the respective one of the second LRUs 116.

Further, in such embodiments, the bus bar assembly 104 can also include a fourth vertical bus 122 (e.g., a laminated bus bar having a relatively low current carrying capacity) and fourth horizontal buses 124 (e.g., non-laminated bus bars) associated with the fourth vertical bus 122.

Figure 1C:
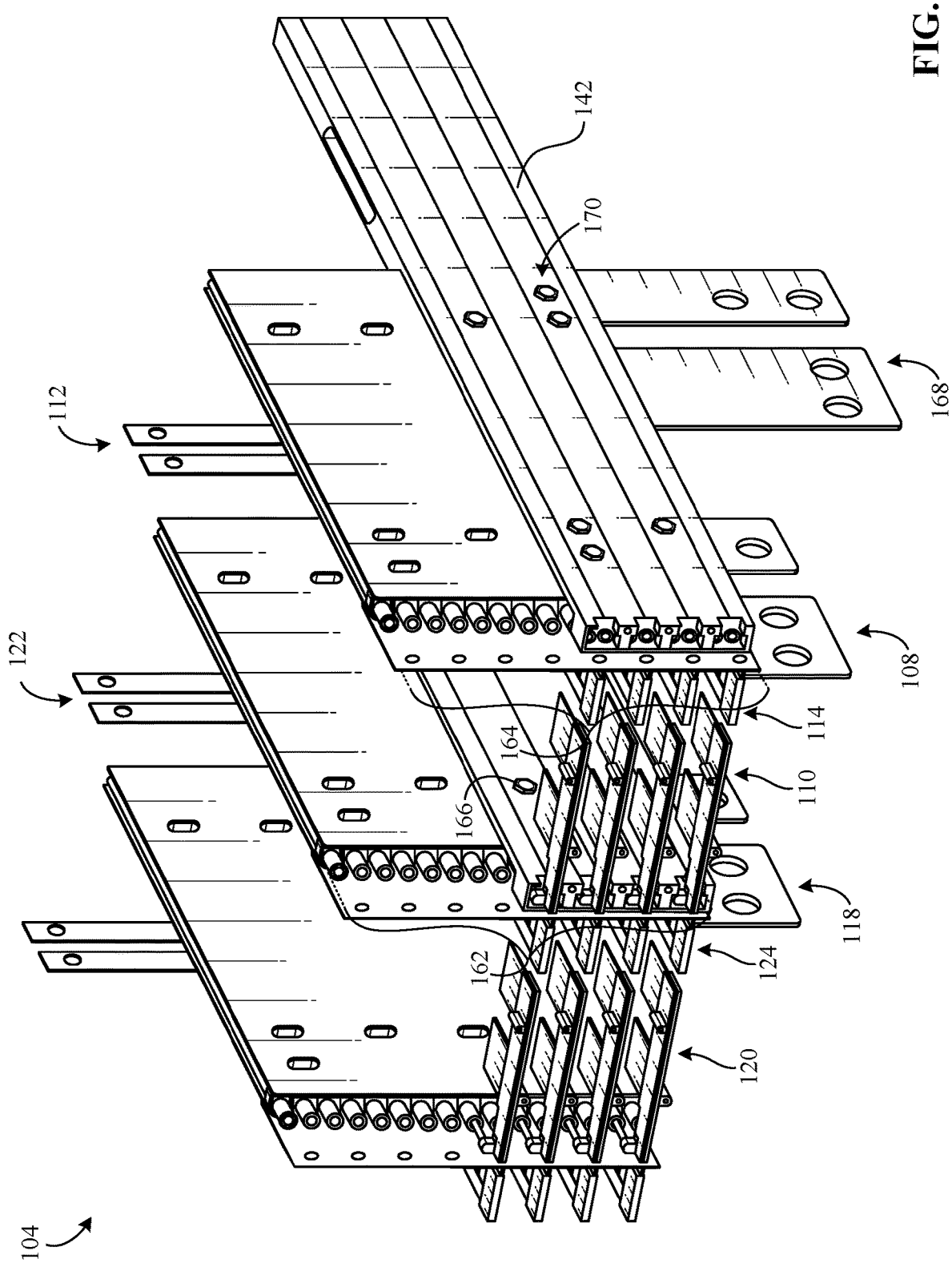
FIG. 1C is a front overhead perspective view of the radar power distribution system of FIG. 1B.

The fourth vertical bus 122 can be separated from the first vertical bus 108, the second vertical bus 112, and the third vertical bus 118. The fourth vertical bus 122 may be substantially similar or the same relative to the second vertical bus 112. Further, the fourth horizontal buses 124 may be substantially similar or the same relative to the second horizontal buses 114. FIG. 1C shows a rear view particularly showing the first through fourth horizontal buses 110, 114, 120, 124.

When the second LRUs 116 are installed on the bus bar assembly 104, each of the fourth horizontal buses 124 can be connected between the fourth vertical bus 122 and a respective one of the second LRUs 116 to provide at least a portion of the electrical power to the respective one of the second LRUs 116. As such, each of the second LRUs 116 can be connectable (e.g., removably connectable) to one of the third horizontal buses 120 and one of the fourth horizontal buses 124 (i.e., a pair of horizontal buses 120, 124).

In some embodiments, similar to the first LRUs 106, each the second LRUs 116 of FIG. 1A can be configured to receive the first voltage and the second voltage to power a circuit card thereon (and likewise, optionally, first and second currents). For example, the third vertical bus 118 and the third horizontal buses 120, together, can be configured to transmit electricity at the first voltage from the power source 102 to one or more (e.g., all) of the second LRUs 116. Further, the fourth vertical bus 122 and the fourth horizontal buses 124, together, can be configured to transmit electricity at the second voltage from the power source 102 to one or more (e.g., all) of the second LRUs 116.

As shown in FIG. 1A, the first vertical bus 108 can be spaced from the second vertical bus 112 by a distance such that a gap 126 is formed between the first and second vertical buses 108, 112. Such gap 126 can be such that the first LRUs 106 can be provided between the first and second vertical buses 108, 112 for connection to the first horizontal buses 110 and the second horizontal buses 114. Further, according to one or more embodiments, the first horizontal buses 110 and the second horizontal buses 114 can be positioned between the first vertical bus 108 and the second vertical bus 112 (i.e., in the gap 126), as shown in FIG. 1A.

On the other hand, the first vertical bus 108 can be coupled to the fourth vertical bus 122, for example, via one or more fasteners and/or fastening methods or techniques. Optionally, the first vertical bus 108 and the fourth vertical bus 122 can be considered a laminated structure. In some such embodiments, an insulating material 128 (e.g., electrically and/or thermally insulating) can be interposed between the two vertical buses 108, 122. Such insulation material can improve thermal capacity and/or performance of the two vertical buses 108, 122, for instance, in high current applications. Stated differently, one or more embodiments of the disclosed subject matter can provide the insulating material 128 between a primary vertical bus 108, 118 and an auxiliary vertical bus 112, 122 that are coupled together. The insulating material 128 can be a dielectric material, such as glass epoxy. Insulation can also be provided between supply and return planes of each individual vertical bus, in a laminated configuration, for instance.

In some embodiments, to support one or more (e.g., all) of the horizontal buses 110, 114, 120, 124 of the bus bar assembly 104, the radar power distribution system 100 can include one or more support structures 130, 132, 134, 136. According to embodiments of the disclosed subject matter such support structures may be referred to as screens, particularly, aperture screens, positioned relative to corresponding one or more apertures and associated RF emitting components. Discussed in more detail below, each of the support structures can have a plurality of openings to allow connectors, particularly RF connectors, to pass therethrough. Optionally, the support structures 130, 132, 134, 136 may be unitary or formed in one piece.

For example, the first screen 130 and the third screen 134, together, can be configured to receive and/or carry the first horizontal buses 110 and the second horizontal buses 114. Similarly, in some embodiments, the second screen 132 and the fourth screen 136, together, can be configured to receive and/or carry the third horizontal buses 120 and the fourth horizontal buses 124. As such, at least a portion of the bus bar assembly 104 can be supported by the screen(s) 130, 132, 134, 136. Additionally, one or more of the screen(s) 130, 132, 134, 136 can be configured to receive a radiating element 138 (diagrammatically shown in FIG. 1A). For example, the radiating element 138 can attach to a side (e.g., a backside) of at least one of the screen(s) 130, 132, 134, 136, as discussed further below in connection with FIG. 3.

In some embodiments, the screen(s) 130, 132, 134, 136 can be positioned relative to each other to form an array, for example, a 2×2 array, as shown in FIG. 1A. Additionally, in some embodiments, the screens 130, 132, 134, 136 of FIG. 1A can be coupled together to substantially form and/or define an integral or single-piece component (i.e., a single screen), for example, via one or more fasteners and/or fastening methods or techniques.

According to the illustrated example of FIG. 1A, four of the first horizontal buses 110 and four of the second horizontal buses 114 can be positioned on and/or coupled to the first screen 130, for example, via one or more fasteners and/or one or more fastening methods or techniques. These four pairs of the horizontal buses 110, 114 of FIG. 1A can form and/or define a building block for the radar power distribution system 100. However, in some embodiments, the building block can be implemented using one or more additional or fewer pairs of the horizontal buses 110, 114. In particular, the radar power distribution system 100 can include at least one such building block. For example, similar to the first screen 130, four of the first horizontal buses 110 of FIG. 1A and four of the second horizontal buses 114 of FIG. 1A can be positioned on and/or coupled to the third screen 134. Further, four of the third horizontal buses 120 of FIG. 1A and four of the fourth horizontal buses 124 of FIG. 1A can be positioned on and/or coupled to the second screen 132. Further still, four of the third horizontal buses 120 of FIG. 1A and four of the fourth horizontal buses 124 of FIG. 1A can be positioned on and/or coupled to the fourth screen 136. Though FIG. 1A depicts four screens 130, 132, 134, 136, in some embodiments, the radar power distribution system 100 can be configured differently, for example, using one or more additional or fewer screens.

Turning now to FIG. 1B, the third and fourth screens 134, 136 and the associated pairs of horizontal buses 110, 114, 120, 124 have been removed for clarity. As shown, each of the first horizontal buses 110 and the second horizontal buses 114 can be positioned on the first screen 130. Further, each of the third horizontal buses 120 and the fourth horizontal buses 124 can be positioned on the second screen 132. As shown in FIG. 1B, the second screen 132 can be positioned adjacent the first screen 130.

In some embodiments, the first vertical bus 108 and the first horizontal buses 110 can form a vertical-to-horizontal configuration in which each of the first horizontal buses 110 is substantially perpendicular relative to the first vertical bus 108. As shown in FIG. 1A, for instance, each of the first horizontal buses 110 has a horizontal orientation. That is, each of the first horizontal buses 110 can extend along and/or can be parallel relative to a horizontal axis or plane. On the other hand, as shown in FIG. 1B, the first vertical bus 108 can have a vertical orientation. That is, the first vertical bus 108 can extend along and/or can be parallel relative to a vertical axis or plane. Further, in such embodiments, the second vertical bus 112 and the second horizontal buses 114 can also form a vertical-to-horizontal configuration in which each of the second horizontal buses 114 is substantially perpendicular relative to the second vertical bus 112. As shown in FIG. 1A, for instance, each of the second horizontal buses 114 can have a horizontal orientation, similar to the first horizontal buses 110. On the other hand, similar to the first vertical bus 108, the second vertical bus 112 can have a vertical orientation.

The first horizontal buses 110 and the second horizontal buses 114 can be distributed (e.g., vertically) across at least a portion of the first screen 130. In some embodiments, the first horizontal buses 110 can be vertically aligned relative to each other. That is, the first horizontal buses 110 can be centered relative to a vertical axis (i.e., the same axis) such that the vertical axis extends through central portions of the respective first horizontal buses 110. Additionally, in such embodiments, the first horizontal buses 110 can be evenly spaced from each other. Similarly, in some embodiments, the second horizontal buses 114 can be vertically aligned to each other and/or evenly spaced from each other. Additionally, in some embodiments, the first horizontal buses 110 can be horizontally aligned to the second horizontal buses 114 whereby each of the first horizontal buses 110 and a respective one of the second horizontal buses 114, together, can be substantially positioned on a same horizontal axis.

In some embodiments, to provide support to the bus bar assembly 104 and/or the screen(s) 130, 132, 134, 136, the radar power distribution system 100 can include one or more radar support structures 140, 142, (i.e., a first radar support structure 140 and a second radar support structure 142), such as shown in FIG. 1B. Each of the radar support structure(s) 140, 142 can be configured to receive and/or carry at least one vertical bus 108, 112, 118, 122 of the bus bar assembly 104. For example, as shown in FIG. 1B, the first vertical bus 108 and the fourth vertical bus 122 can be positioned on and/or coupled (e.g., removably coupled) to the first radar support structure 140. Further, the second vertical bus 112 (and another vertical bus extending in a direction opposite the second vertical bus 112) can be positioned on and/or coupled to the second radar support structure 142. Similarly, in some embodiments, the third vertical bus 118 can be configured to be positioned on and/or coupled to a third radar support structure (not expressly shown) of the radar power distribution system 100. Thus, the bus bar assembly 104 can be at least partially supported by the radar support structure(s) 140, 142 of the radar power distribution system 100. Incidentally, note that in some embodiments at least one of the vertical buses of may not be paired with another vertical bus to supply voltage. For instance, the vertical bus extending vertically in a direction opposite the second vertical bus 112 in FIG. 1A may not be paired with another vertical bus that extends in the same direction as the second vertical bus 112 and that is separated by another space 126 (i.e., to the left of second vertical bus 112). In such a case the unpaired vertical bus may not be utilized to supply voltage.

To facilitate installing, removing, and/or replacing an LRU, the bus bar assembly 104 can also include a blind mate interface 144 that is at least partially formed by the first and second horizontal buses 110, 114. In particular, the blind mate interface 144 can be structured and/or configured to removably connect each of the first LRUs 106 to a corresponding pair of the first and second horizontal buses 110, 114. For example, a first pair of the first and second horizontal buses 110, 114, to which one of the first LRUs 106 removably connects via the blind mate interface 144, can be represented by the dashed box of FIG. 1B.

Figure 2:
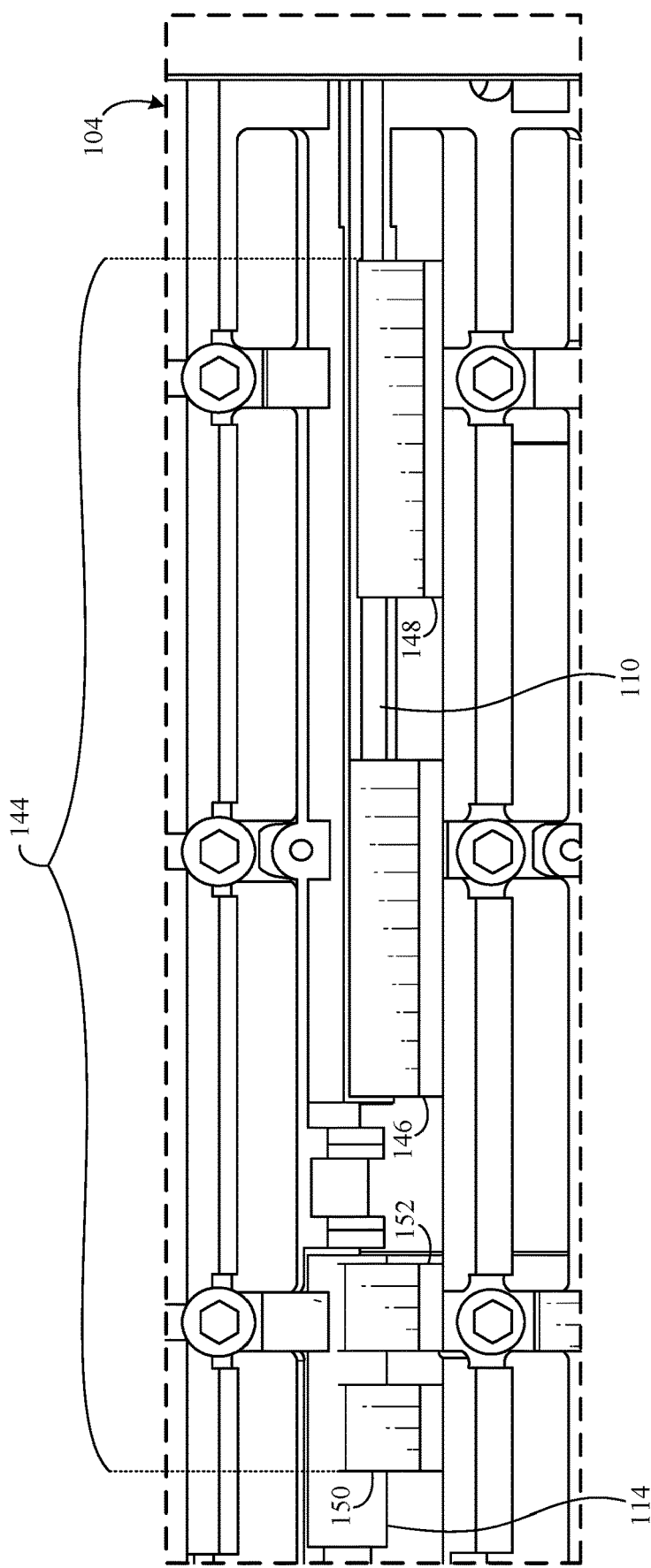
FIG. 2 is an enlarged partial-view of a bus bar assembly, according to one or more embodiments of the disclosed subject matter, of the radar power distribution system of FIG. 1A.

As shown in the enlarged view of the blind mate interface 144 according to FIG. 2, the blind mate interface 144 can include primary supply tabs 146, each of which can be coupled to a respective one of the first horizontal buses 110. Optionally, the blind mate interface 144 can include four of the primary supply tabs 146, such as shown in FIG. 1B and FIG. 2. The blind mate interface 144 can also include primary return tabs 148, each of which is coupled to a respective one of the first horizontal buses 110 and positioned adjacent one of the primary supply tabs 146.

According to one or more embodiments, the blind mate interface 144 can also include auxiliary supply tabs 150, each of which can be coupled to a respective one of the second horizontal buses 114. The blind mate interface 144 may include four of the auxiliary supply tabs 150, such as shown in FIG. 1B. And the blind mate interface 144 can also include auxiliary return tabs 152, each of which can be coupled to a respective one of the second horizontal buses 114 and positioned adjacent one of the auxiliary supply tabs 150. The blind mate interface 144 may include four auxiliary return tabs 152, such as shown in FIG. 1B.

The primary supply tabs 146, the primary return tabs 148, the auxiliary supply tabs 150, and the auxiliary return tabs 152 can be insertable in respective ones of the first LRUs 106 to supply the electrical power thereto during radar operation. Put another way, the first LRUs 106 can be inserted into corresponding tabs of the primary supply tabs 146, the primary return tabs 148, the auxiliary supply tabs 150, and the auxiliary return tabs 152. For example, each of the first LRUs 106 can include power connections that receive and/or engage a set of the tabs 146, 148, 150, 152 (e.g., one of the primary supply tabs 146, one of the primary return tabs 148, one of the auxiliary supply tabs 150, and one of the auxiliary return tabs 152) corresponding to a pair of the first and second horizontal buses 110, 114.

The primary supply and return tabs 146, 148 may be referred to as first blind mate connectors. Thus, the blind mate interface 144 can include first blind mate connectors coupled to the first horizontal buses 110, whereby each of the first horizontal buses 110 can include a pair of the first blind mate connectors (e.g., one of the primary supply tabs 146 and an adjacent one of the primary return tabs 148) configured to removably connect to a respective one of the first LRUs 106. Similarly, the auxiliary supply and return tabs 150, 152 may be referred to as second blind mate connectors. Thus, the blind mate interface 144 can include second blind mate connectors coupled to the second horizontal buses 114, whereby each of the second horizontal buses 114 can include a pair of the second blind mate connectors (e.g., one of the auxiliary supply tabs 150 and an adjacent one of the auxiliary return tabs 152) configured to removably connect to a respective one of the first LRUs 106.

In some embodiments, the blind mate interface 144 can also be at least partially formed and/or defined by one or more other horizontal buses of the bus bar assembly 104 such as by the third horizontal buses 120 and the fourth horizontal buses 124. In such embodiments, the blind mate interface 144 can be structured and/or configured to removably connect each of the second LRUs 116 to a corresponding pair of the third and fourth horizontal buses 120, 124, similar to the first LRUs 106. For example, as shown in FIG. 1B, the blind mate interface 144 can include additional primary supply and return tabs 154, 156 (i.e., third blind mate connectors) associated with the third horizontal buses 120 and additional auxiliary supply and return tabs 158, 160 (i.e., fourth blind mate connectors) associated with the fourth horizontal buses 124.

FIG. 1C, as noted above, is another view of the bus bar assembly 104. As shown, all of the screen(s) 130, 132, 134, 136 have been removed for clarity. According to the illustrated example of FIG. 1C, the bus bar assembly 104 can include a first connection interface (e.g., a pin and socket interface) 162 to electrically couple the first horizontal buses 110 to the first vertical bus 108. Such connection may facilitate providing the vertical-to-horizontal configuration associated with the first vertical bus 108 and the first horizontal buses 110. In some embodiments, the first connection interface 162 can be structured and/or configured to electrically couple (a) each of the primary supply tabs 146 to a primary supply plate of the first vertical bus 108 and (b) each of the primary return tabs 148 to a primary return plate of the first vertical bus 108, as discussed further below in connection with FIGS. 6, 7, 8A, 8B, 9, and 10. Additionally, in some embodiments, the first connection interface 162 can electrically couple the third horizontal buses 120 to the third vertical bus 118, in a similar manner.

The bus bar assembly 104 can also include a second connection interface (e.g., a fastener interface such as a screw and plate interface) 164 to electrically couple the second horizontal buses 114 to the second vertical bus 112, such as shown in FIG. 1C. Such connection may facilitate providing the vertical-to-horizontal configuration associated with the second vertical bus 112 and the second horizontal buses 114. In some embodiments, the second connection interface 164 can be structured and/or configured to electrically couple (a) each of the auxiliary supply tabs 150 to an auxiliary supply plate of the second vertical bus 112 and (b) each of the auxiliary return tabs 152 to an auxiliary return plate of the second vertical bus 112, as discussed further below in connection with FIGS. 11-15. Additionally, in some embodiments, the second connection interface 164 can electrically couple the fourth horizontal buses 124 to the fourth vertical bus 122, in a similar manner.

The first vertical bus 108 and the fourth vertical bus 122 can be supported by and/or coupled to the first radar support structure 140, as previously mentioned. For example, one or more fasteners 166 can extend through the first vertical bus 108, the fourth vertical bus 122, and the first radar support structure 140. Similarly, other pairs of vertical buses can be likewise supported by and/or coupled to a radar support structure. For example, the second vertical bus 112 and a fifth vertical bus 168 (e.g., a laminated bus bar having a relatively high current carrying capacity) can be supported by and/or coupled to the second radar support structure 142, for example, via one or more fasteners 170 extending through the second vertical bus 112, the fifth vertical bus 168, and the second radar support structure 142.

Turning again to FIG. 2, which is an enlarged partial-view of the bus bar assembly 104 of FIG. 1B showing the first pair of horizontal buses 110, 114, the first pair of horizontal buses 110, 114 can include a first set of the tabs 146, 148, 150, 152 of the blind mate interface 144. As such, the first pair of horizontal buses 110, 114 can include one of the primary supply tabs 146, one of the primary return tabs 148, one of the auxiliary supply tabs 150, and one of the auxiliary return tabs 152. The first set of the tabs 146, 148, 150, 152 can be insertable in one of the first LRUs 106, thereby removably connecting the first LRU 106 to the first pair of the horizontal buses 110, 114 such that the first LRU 106 can receive electrical power from the power source 102.

Figure 3:
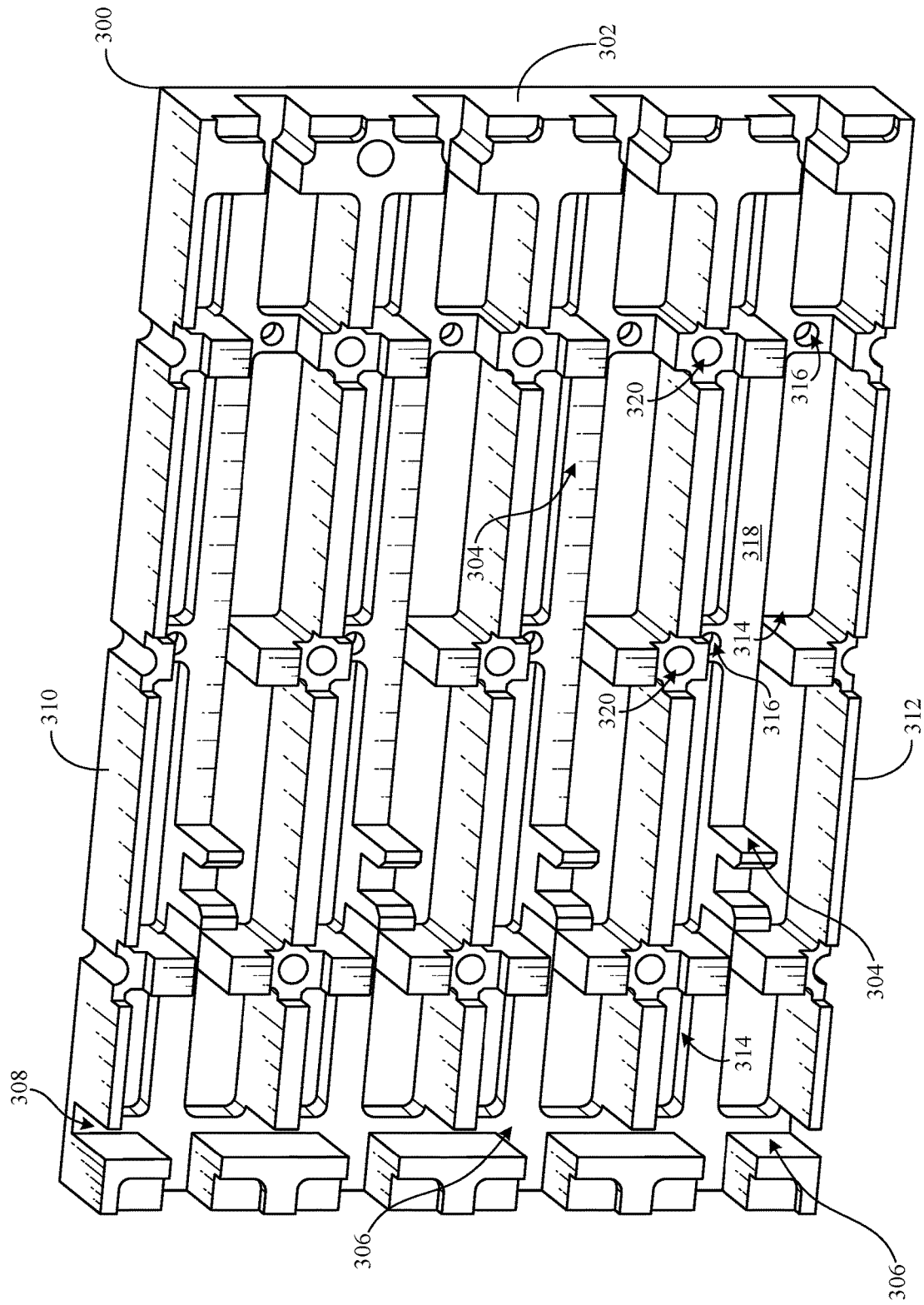
FIG. 3 is a view of a support structure, according to one or more embodiments of the disclosed subject matter, of the radar power distribution system of FIG. 1A.

FIG. 3 is a view of a support structure (e.g., an aperture screen) 300 according to one or more embodiments of the disclosed subject matter. In some embodiments, the support 300 can correspond to at least one of the first, second, third, or fourth support structures 130, 132, 134, 136 from FIGS. 1A and 1B. Optionally, the support structure 300, whether representative of a single support structure or the multiple first, second, third, and fourth support structures 130, 132, 134, 136, can be unitary or formed in one piece. According to the illustrated example, the support structure 300 can include a body 302 and first recessed areas or pockets 304 formed by the body 302, four of which are shown in this example. Each of the first pockets 304 can be sized and/or shaped to receive a primary horizontal bus, such as one of the first or third horizontal buses 110, 120. For example, four of the first or third horizontal buses 110, 120 of FIGS. 1A, 1B, and 1C can be insertable in respective ones of the first pockets 304.

The support structure 300 of FIG. 3 can also include second recessed areas or pockets 306 formed by the body 302, four of which are shown in this example. As shown in FIG. 3, each of the second pockets 306 can be positioned adjacent one of the first pockets 304. Each of the second pockets 306 can be sized and/or shaped to receive an auxiliary horizontal bus, such as one of the second or fourth horizontal buses 114, 124. For example, four of the second or fourth horizontal buses 114, 124 of FIGS. 1A, 1B, and 1C can be insertable in respective ones of the second pockets 306.

In some embodiments, the support structure 300 can include a channel 308 formed by the body 302. In such embodiments, the channel 308 can be sized, and/or shaped to receive a side of the first vertical bus 108 or the third vertical bus 118, which can facilitate forming the second connection interface 164. As shown in FIG. 3, the channel 308 can extend from a first side 310 of the body 302 to a second side 312 of the body 302 opposite the first side 310.

In some embodiments, the support structure 300 can include gaps 314 extending entirely through the body 302, which can allow radio frequency (RF) connectors to pass through the body 302. That is, one or more (e.g., all) of the gaps 314 of FIG. 3 can be sized and/or shaped such that RF connectors can pass through at least one of the gaps 314 to mate with the radiating element 138 (diagrammatically shown in FIG. 1A).

In some embodiments, to facilitate coupling of the first or third horizontal buses 110, 120 to the body 302 of the support structure 300, the support structure 300 can include first apertures 316 (e.g., circular openings) distributed on the body 302. In one embodiment, the first apertures 316 can be positioned on areas of the body 302 forming the first pockets 304. For example, two of the first apertures 316 can be positioned on a surface 318 of the body 302 that partially forms a lowermost one of the first pockets 304 (in the orientation of FIG. 3). The first apertures 316 of the support structure 300 can extend at least partially (e.g., entirely)

through the body 302. Optionally, each of the first apertures 316 can align to an adapter of one of the first or third horizontal buses 110, 120 and receive a fastener for coupling, as will be discussed further below in connection with FIG. 9.

In some embodiments, to facilitate coupling the radiating element 138 to the body 302 of the support structure 300, the support structure 300 can include second apertures 320 (e.g., circular openings) distributed on the body 302. The second apertures 320 may be thru holes for a fastener to be threaded into a radiating tile assembly that can be provided on the other side of the support structure 300.

Although FIG. 3 depicts aspects in connection with the support structure 300, in some embodiments, such aspects likewise apply to one or more other support structures associated with the bus bar assembly 104, such as one or more (e.g., all) of the first support structure 130, the second support structure 132, the third support structure 134, and/or the fourth support structure 136.

Figure 4:
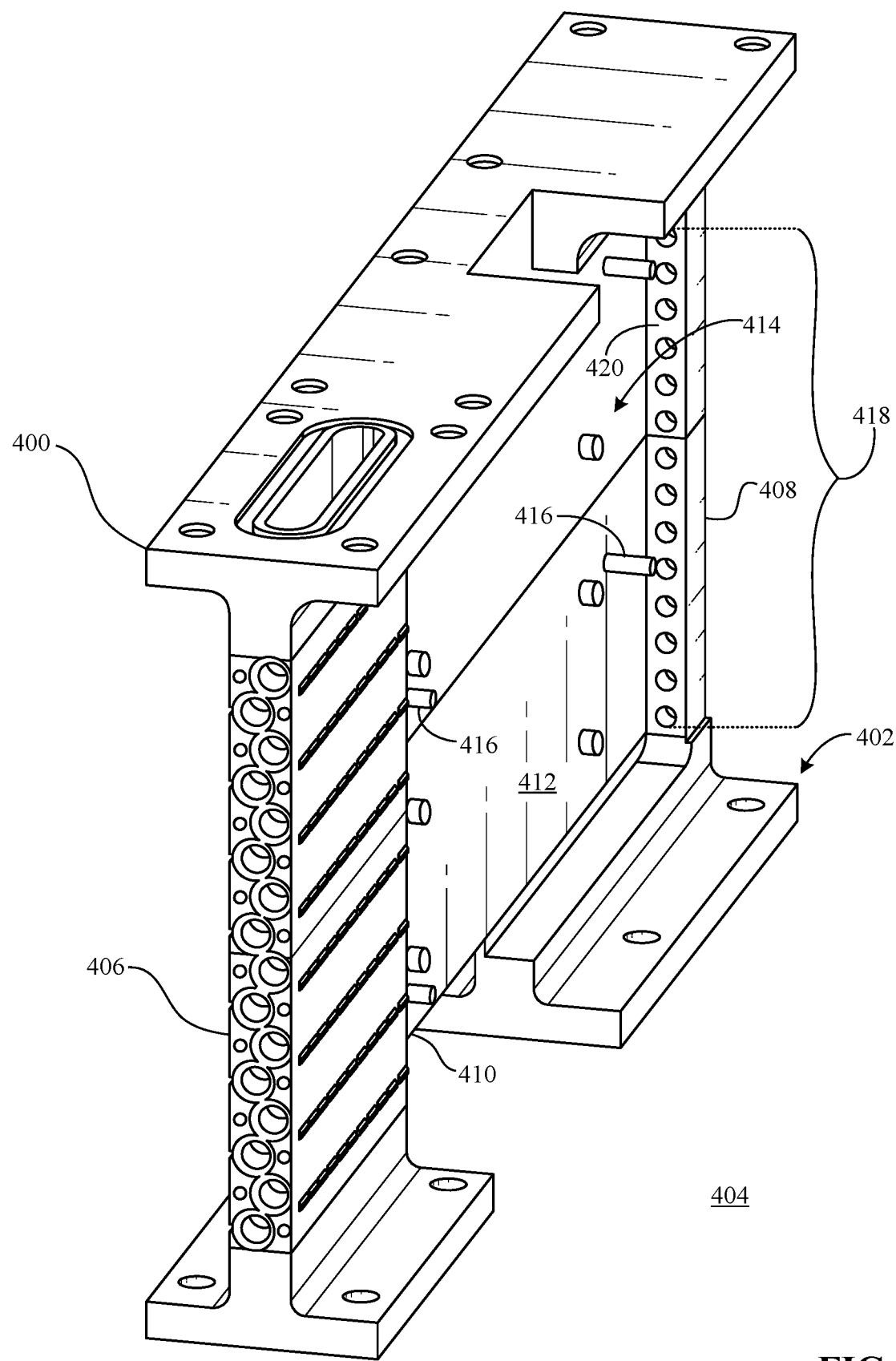
FIG. 4 is a view of a radar support structure according to one or more embodiments of the disclosed subject matter.

FIG. 4 is a view of a radar support structure 400 according to one or more embodiments of the disclosed subject matter. In some embodiments, the radar support structure 400 of FIG. 4 can correspond be formed in one piece and, hence, can form the first radar support structure 140 of FIGS. 1B and 1C and the second radar support structure 142 of FIGS. 1B and 1C, for instance.

According the illustrated example of FIG. 4, the radar support structure 400 can include a first portion 402 (e.g., a base or bottom portion) that can be positioned on and/or coupled to, for example, a support surface 404. The radar support structure 400 can also include a first column 406 (e.g., a rectangular support column) and a second column 408 (e.g., a rectangular support column) connected to and extending away from the first portion 402. The radar support structure 400 can also include a wall 410 connected between the first and second columns 406, 408. The wall 410 can form and/or define a mounting surface 412 that can be sized and/or shaped to receive at least one vertical bus 108, 112, 118, 122 of the bus bar assembly 104, such as the first and fourth vertical buses 108, 122. In some embodiments, the mounting surface 412 of the wall 410 can form a recess into which at least one of the vertical buses 108, 112, 118, 122 can be positioned.

To facilitate coupling of one or more of the vertical buses 108, 112, 118, 122 to the radar support structure 400, the radar support structure 400 can include a coupling mechanism 414. The coupling mechanism 414 can include one or more fasteners 416 (e.g., bolts, studs, etc.) positioned on the wall 410 and configured to support a load imparted on the fastener(s) 416 by the vertical bus 108, 112, 118, 122. For example, the fastener(s) 416 can extend at least partially (e.g., entirely) through the wall 410. In some embodiments, the fastener(s) 416 can be arranged to form a predetermined pattern on wall 410, which may facilitate orienting the vertical bus 108, 112, 118, 122 relative to the wall 410.

In some embodiments, the radar support structure 400 can include apertures 418 (e.g., circular openings) distributed at least partially along a side of the second column 408 and positioned on a surface 420 of the second column 408 adjacent the mounting surface 412. Each of the apertures 400 of the third radar support structure 400 can be a pass through sized and/or shaped to receive a portion (e.g., a socket and/or a pin) of the first connection interface 162 (of FIG. 1C). In such embodiments, the apertures 418 can extend entirely through the second column 408.

Although FIG. 4 depicts aspects in connection with the radar support structure 400, in some embodiments, such aspects likewise apply to one or more other radar support structures associated with the bus bar assembly 104, such as the first radar support structure 140 and/or the second radar support structure 142.

Figure 5:
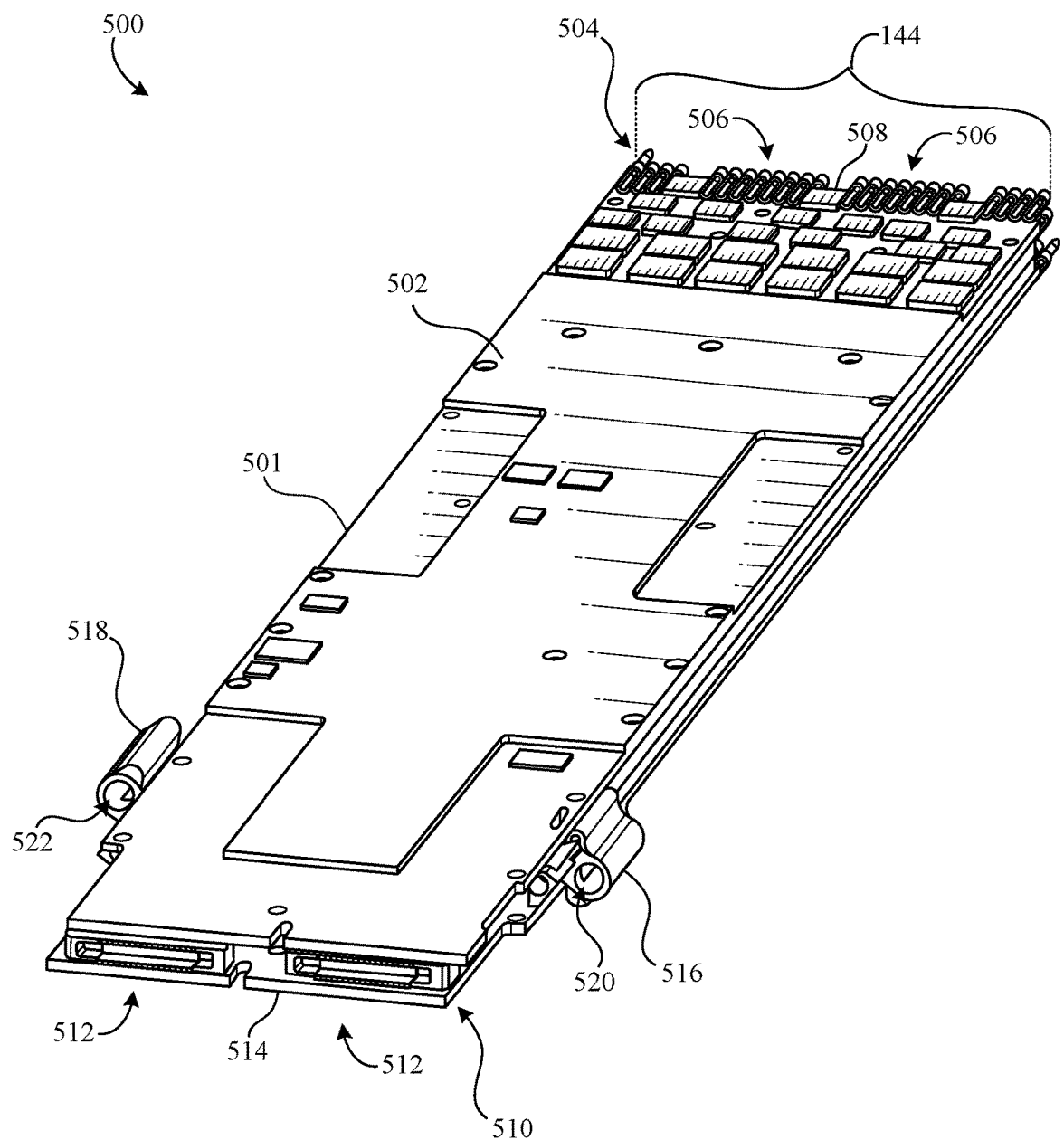
FIG. 5 is a view of a line-replaceable unit (LRU) according to one or more embodiments of the disclosed subject matter that may be removably connected to a radar power distribution system according to one or more embodiments of the disclosed subject matter.

FIG. 5 shows an example LRU 500 associated with radar functionality and processing according to one or more embodiments of the disclosed subject matter. In some embodiments, the LRU 500 can correspond to at least one of the first LRUs 106 and/or at least one of the second LRUs 116. According to the illustrated example of FIG. 5, the LRU 500 can include a body 501 and at least one circuit card 502 positioned on and/or supported by the body 501 of the LRU 500. In some embodiments, the circuit card 502 can be configured to operate using two voltages (e.g., separate and/or different voltages) provided by a pairing of vertical and horizontal buses as described above.

The LRU 500 can include one or more RF connections 504 operatively coupled to the circuit card 502. In particular, the one or more RF connections 504 can be configured to pass through the support structure 300, particularly corresponding gaps 314 thereof.

In some embodiments, the LRU 500 may include one or more other connections operatively coupled to the circuit card 502, such as a digital connection 510 for the next higher assembly radar. In such embodiments, digital connection 510 of the LRU 500 may include one or more other ports or slots 512 that can be coupled to the body. The other slot(s) 512 can be positioned on a second side 514 of the body 501 opposite the first side 508.

In some embodiments, to facilitate coupling of the LRU 500 to a radar support structure, the LRU 500 may include one or more connectors 516, 518 coupled to the body 501. Two of the connectors 516, 518 of the LRU 500 are shown in this example (i.e., a first connector 516 and a second connector 518), and may be positioned on opposite sides of the body 501. As shown in FIG. 5, the first connector 516 of the LRU 500 may define an opening 520 (e.g., a circular opening) configured to align to a portion of a radar support structure and receive a fastener for coupling the first connector 516 to the portion of the radar support structure. Similarly, the second connector 518 may define an opening 522 (e.g., a circular opening) configured to align to a portion of a different radar support structure and receive a fastener for coupling the second connector 518 to the portion of the different radar support structure.

Although FIG. 5 depicts aspects in connection with the LRU 500, in some embodiments, such aspects likewise apply to one or more other LRUs associated with the bus bar assembly 104, such as one or more (e.g., all) of the first LRU 106 and/or the second LRUs 116.

Figure 6:
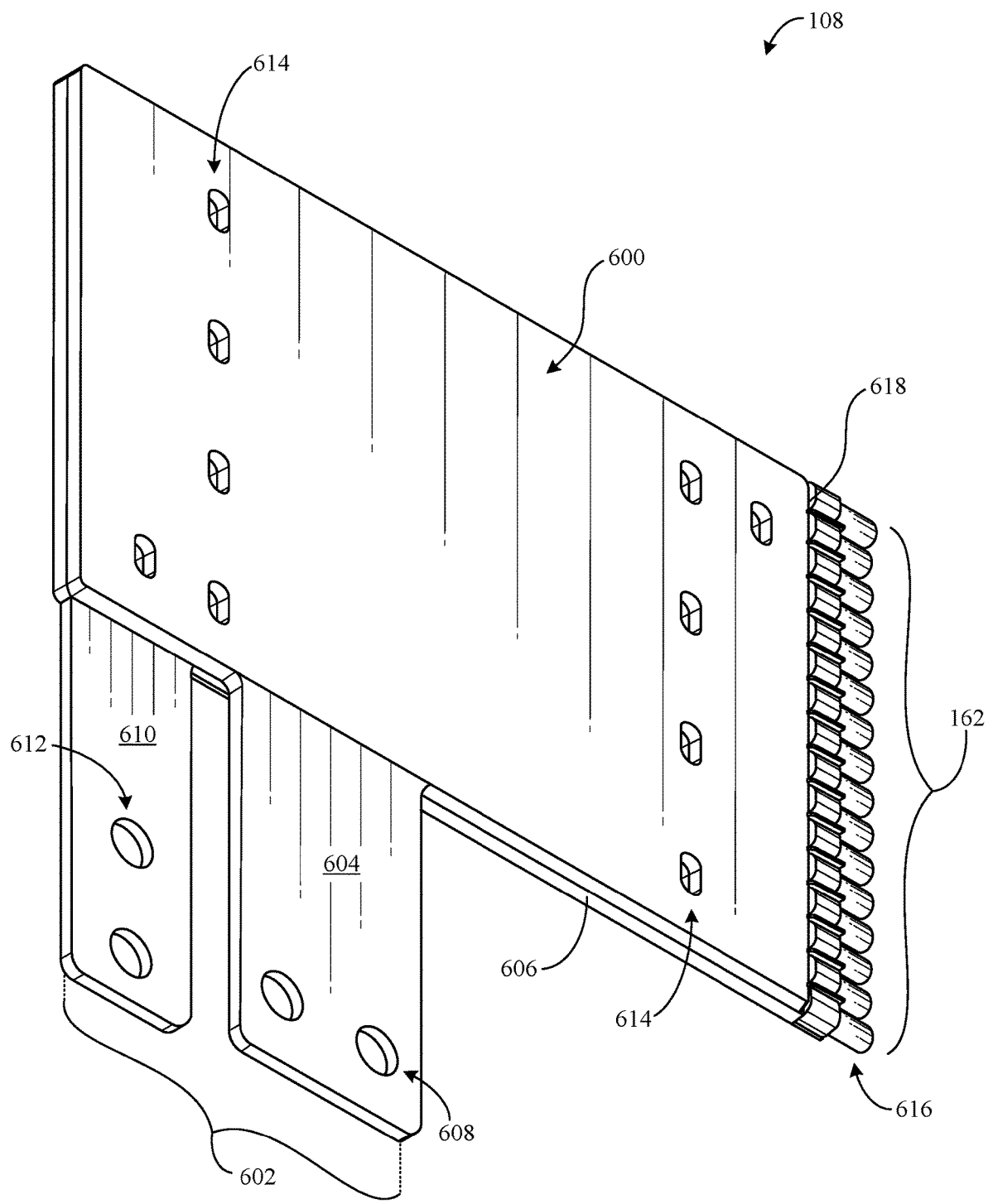
FIG. 6 is a view of a first vertical bus in accordance with one or more embodiments of the disclosed subject matter.

FIG. 6 is a view of the first vertical bus 108 according to embodiments of the disclosed subject matter. The first vertical bus 108 can have a body 600. To facilitate electrical coupling of the first vertical bus 108 to the power source 102, a connection interface 602 can extend from the body 600. FIG. 6 shows the connection interface 602 extending or projecting from a first side 606 of the body 600. According to one or more embodiments, the connection interface 602 may be formed in one-piece with the body 600. Optionally, the body 600 can be planar, such as shown in FIG. 6. The connection interface 602 also may be planar, such as shown in FIG. 6.

The connection interface 602 can have a plurality of projections (e.g., fins or tabs), including a first projection 604 and a second projection 610. Thus, in one or more embodiments, the body 600 can be a multi-piece body (e.g., laminated) with the first projection 604 and the second projection 610 projecting from respective different body portions of the body 600. According to one or more embodiments, the first projection 604 can be formed in one-piece with a first body portion of the body 600 and the second projection 610 can be formed in one-piece with a second body portion of the body 600 different and distinct from the first body portion.

In some embodiments, the first projection 604 may include one or more first apertures 608 (e.g., circular openings). Additionally or alternatively, the second projection 610 can include one or more second apertures (e.g., circular openings). The configuration (e.g., number, size, arrangement, etc.) of the one or more apertures 608 can be different from the configuration (e.g., number, size, arrangement, etc.) of the one or more apertures 612. Such apertures 608, 612 may facilitate electrically coupling of the first projection 604 and the second projection 610 to the power source 102, for instance, via additional structure and electrical coupling (e.g., wiring). For example, the apertures 608, 612 may be configured to receive or otherwise interface with a fastener.

The first projection 604 and the second projection 610 may be spaced from each other in one or more directions. For instance, first projection 604 may be separated from second projection 610 in a thickness direction of the first vertical bus 108. Optionally, the first projection 604 and the second projection 610 may be offset from each other in a length direction of the first vertical bus 108. FIG. 6, for instance, shows the first projection 604 closer to the first connection interface 162 than the second projection 610 is to the first connection interface 162. Optionally, the first tab 604 and the second tab 610 are parallel or substantially parallel to each other, such as shown in FIG. 6.

In some embodiments, to facilitate supporting the first vertical bus 108 on the first radar support structure 140, for instance, the first vertical bus 108 may include one or more apertures 614 positioned on the body 600 and extending at least partially (e.g., entirely) through the body 600. For example, the aperture(s) 614 of the first vertical bus 108 can be configured to receive the fastener(s) 166 associated with the first radar support structure 140, such as shown in FIG. 1C.

In some embodiments, the first connection interface 162 can include sockets 616 (e.g., supply sockets and return sockets) coupled to the body 600 of the first vertical bus 108. Each of the sockets 616 may be connected to one of the first or second projections 604, 610 of the connection interface 602 via respective conductive layers of the body 600. The sockets 616 may be configured to receive pins associated with the first horizontal buses 110, as discussed further below. As shown in FIG. 6, the sockets 616 can be positioned on a second side 618 of the body 600. In such embodiments, the sockets 616 can be distributed along at least portion of a length of the second side 618. As shown in FIG. 6, for instance, the sockets 616 can be distributed along the entire length of the second side 618.

Figure 7:
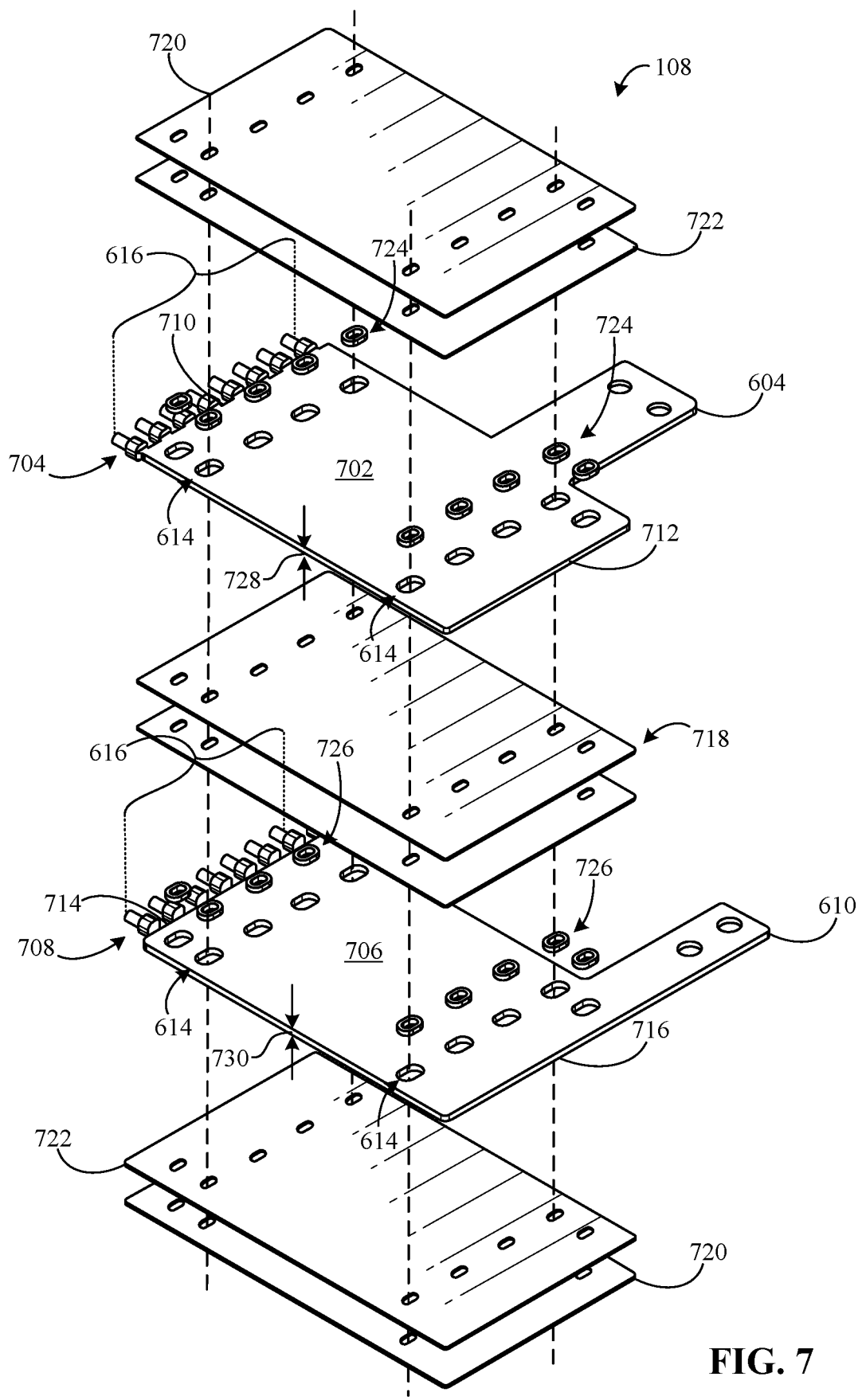
FIG. 7 is an exploded view of the first vertical bus of FIG. 6.

FIG. 7 is an exploded view of the first vertical bus 108 according to one or more embodiments of the disclosed subject matter. According to the illustrated example of FIG. 7, the first vertical bus 108 can include a first conductive layer 702 (e.g., copper) and supply sockets 704 of the sockets 616 formed on and/or coupled to the first conductive layer 702. Further, the first vertical bus 108 can include a second conductive layer 706 (e.g., copper) and return sockets 708 of the sockets 616 formed on and/or coupled to the second conductive layer 706. The first conductive layer 702 can connect the first projection 604 to the supply sockets 704 such that electricity is transmittable through the first conductive layer 702 between the first projection 604 and the supply sockets 704. The second conductive layer 706 can connect the second projection 610 to the return sockets 708 such that electricity is transmittable through the second conductive layer 706 between the second projection 610 and the return sockets 708.

The first projection 604 of the connection interface 602 can coupled to the first conductive layer 702. Optionally, as shown in FIG. 7, the first projection 604 and the first conductive layer 702 of the first vertical bus 108 can form and/or define an integral or single-piece component. Similarly, the second projection 610 can be coupled to the second conductive layer 706. Optionally, as shown in FIG. 7, the second projection 610 and the second conductive layer 706 of the first vertical bus 108 can form and/or define an integral or single-piece component.

As shown in FIG. 7, the supply sockets 704 can be distributed at least partially along a first side 710 of the first conductive layer 702. Further, as shown in FIG. 7, the first projection 604 of the connection interface 602 can be positioned between the first side 710 and a second side 712 of the first conductive layer 702 opposite the first side 710. Additionally, the return sockets 708 can be distributed at least partially along a first side 714 of the second conductive layer 706 adjacent the supply sockets 704. As shown in FIG. 7, for instance, the second projection 610 of the connection interface 602 can be positioned at or adjacent a second side 716 of the second conductive layer 706 opposite the first side 714.

To insulate the first conductive layer 702 from the second conductive layer 706, the first vertical bus 108 can include one or more inner or first insulation layers 718 (e.g., dielectric insulation) interposed between the first conductive layer 702 and the second conductive layer 706. Optionally, when the first vertical bus 108 is produced, the first insulation layer(s) 718 can be coupled between the first and second conductive layers 702, 706 to provide insulation thereto. As shown in FIG. 7, for instance, the first insulation layer(s) 718 of the first vertical bus 108 can be sized and/or shaped to substantially cover inner, opposing surfaces of the respective first and second conductive layers 702, 706 (i.e., surfaces that face each other).

The first vertical bus 108 may also include at least two protective layers 720 between which the first and second conductive layers 702, 706 are positioned. In such embodiments, to provide additional insulation, the first vertical bus 108 may also include at least two outer or second insulation layers 722 (e.g., dielectric insulation) between which the first and second conductive layers 702, 706 are positioned. In such embodiments, each of the second insulation layers 722 of the first vertical bus 108 can be interposed between one of the protective layers 720 and a respective one of the first or second conductive layers 702, 706.

In some embodiments, the first vertical bus 108 may include first spacers 724, each of which may be sized and/or shaped to fit within a portion of a respective one of the apertures 614 defined by the first conductive layer 702. Each of the first spacers 724 may include an aperture positioned thereon through which a fastener is to extend, such as one of the fastener(s) 166 associated with the first radar support structure 140. The first spacers 724 of the first vertical bus 108 can insulate such fasteners from the first conductive layer 702. Similarly, in some embodiments, the first vertical bus 108 may include second spacers 726, each of which can be sized and/or shaped to fit within a portion of a respective one of the apertures 614 defined by the second conductive layer 706.

In some embodiments, the first conductive layer 702 can be implemented as a plate (e.g., a relatively thick, copper plate), which may be referred to as a primary supply plate or a supply plate. As shown in FIG. 7, the first conductive layer 702 can have a thickness 728 that is substantially uniform or slightly varies across the first conductive layer 702 from the first side 710 of the first conductive layer 702 to the second side 712 of the first conductive layer 702. Similarly, in some embodiments, the second conductive layer 706 can be implemented as a plate (e.g., a relatively thick, copper plate), which may be referred to as a primary return plate or a return plate. As shown in FIG. 7, the second conductive layer 706 can have a thickness 730 that is substantially uniform or slightly varies across the second conductive layer 706 from the first side 714 of the second conductive layer 706 to the second side 716 of the second conductive layer 706. In some embodiments, the thickness 730 of the second conductive layer 706 can be substantially equal to or the same as the thickness 728 of the first conductive layer 702.

The conductive layers 702, 706 of the first vertical bus 108 can be constructed of, for example, copper and/or any other suitable conductor. Further, the insulation layers 718, 722 of the first vertical bus 108 can be constructed of, for example, Kapton and/or any other suitable insulator. Further still, the protective layers 720, the first spacers 724, and/or the second spacers 726 of the first vertical bus 108 can be constructed of, for example, glass or any other suitable insulator.

FIG. 8A is a side view of the first vertical bus 108 and shows the sockets 616 positioned thereon. Notably, the sockets 616 may be directly aligned with each other. In some embodiments, to insulate the sockets 616 from each other, the first vertical bus 108 may include insulation features 802 (e.g., tabs or inserts) interposed between adjacent ones of the sockets 616. In such embodiments, each of the insulation features 802 may extend away from the body 600 of the first vertical bus 108 and between adjacent ones of the sockets 616 to provide insulation thereto.

FIG. 8B is an enlarged partial-view of the first vertical bus 108 of FIG. 8A, and shows a socket 803 (e.g., a supply or return socket) according to one or more embodiments of the disclosed subject matter. That is, the socket 803 of FIG. 8B corresponds to one of the sockets 616 of FIGS. 6, 7, and 8A. According to the illustrated example of FIG. 8B, the socket 803 can include a body 804 connected to the first or second conductive layer 702, 706 and an aperture 806 centrally disposed on the body 804. For example, the body 804 of the socket 803 can form and/or define the aperture 806. And the first vertical bus 108 can include a socket connector 808 positioned in the aperture 806 of the socket 803. As such, the aperture 806 of the socket 803 can be sized and/or shaped to receive and retain the socket connector 808, for example, such that the socket connector 808 may not be easily removable from the socket 803. As shown in FIG. 8B, at least an outer portion of the socket connector 808 can be in direct contact with an inner surface 810 of the body 804. As shown in FIG. 8B, two of the insulation features 802 may be interposed between the socket 803 and adjacent ones of the sockets 616 such that the socket body 804 is between the two insulation features 802. That is, the insulation features 802 can be positioned on opposite sides of the body 804 of the socket 803.

Although FIG. 8B depicts aspects in connection with a single socket 803, in some embodiments, such aspects likewise apply to one or more other sockets of the first connection interface 162, such as all of the sockets 616, 704, 708 of the first vertical bus 108 and/or one or more other sockets associated with a different primary vertical bus (e.g., the third vertical bus 118). For example, each of the sockets of the first connection interface 162 can include a socket connector 808 therein configured to receive a pin. Further, although FIGS. 6, 7, 8A, and 8B depict aspects in connection with the first vertical bus 108, in some embodiments, such aspects likewise apply to one or more other primary vertical buses of the bus bar assembly 104, such as the third vertical bus 118.

Figure 9:
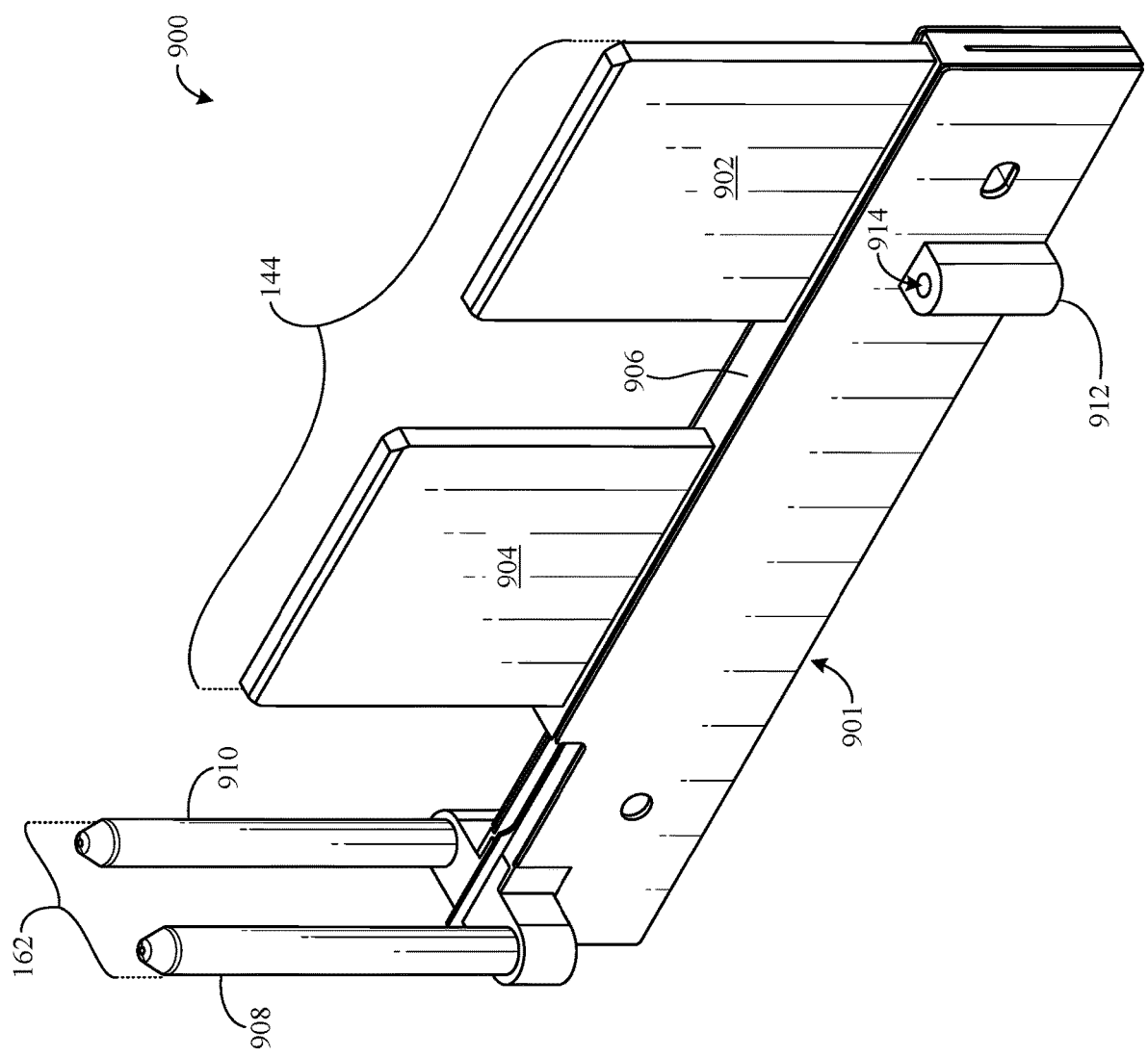
FIG. 9 is a view of a first horizontal bus according to one or more embodiments of the disclosed subject matter.

FIG. 9 is a view of a first horizontal bus 900 according to embodiments of the disclosed subject matter. In some embodiments, the first horizontal bus 900 can correspond to at least one of the first horizontal buses 110 of FIGS. 1A, 1B, and 1C and/or at least one of the third horizontal buses 120 of FIGS. 1A, 1B, and 1C. As discussed above, the first horizontal bus 900 can define, at least in part, the blind made interface 144. As such, the first horizontal bus 900 can have body 901, a primary supply projection 902 (e.g., tab or fin) and a primary return projection 904 (e.g., tab or fin). The primary supply projection 902 and the primary return projection 904 can be positioned on the first horizontal bus 900 adjacent each other, such as shown in FIG. 9.

The primary supply projection 902 may correspond to at least one of the primary supply tabs 146, 154 of FIG. 1B, and the primary return projection 904 may correspond to at least one of the primary return tabs 148, 156 of FIG. 1B. Each of the primary supply and return projection 902, 904 can be coupled to the body 901 of first horizontal bus 900, for example, via one or more lamination processes or techniques. As shown in FIG. 9, the primary supply projection 902 can project from a first side 906 of the body 901 and/or can otherwise extend away from the first side 906, for instance, to receive a portion (e.g., one of the slots 506) of an LRU. Similarly, the primary return projection 904 can project from the first side 906 and/or can otherwise extend away from the first side 906 to receive a different portion of the LRU.

According to the illustrated example of FIG. 9, the first connection interface 162 can include a supply pin 908 and a return pin 910, for instance, for a primary vertical bus electrically coupled to the first horizontal bus 900. The supply pin 908 can be connected to the primary supply projection 902 of the first horizontal bus 900. Similarly, the return pin 910 can be connected to the primary return projection 904. In particular, the supply pin 908 can be insertable in a one of the supply sockets 704 and/or a socket connector 808 therein, and the return pin 910 can be insertable in one of the return sockets 708 and/or a socket connector 808 therein. In this manner, the first connection interface 162 of the bus bar assembly 104 can electrically couple (a) the primary supply projection 902 to the first conductive layer 702 of the first vertical bus 108 and (b) the primary return projection 904 to the second conductive layer 706 of the first vertical bus 108.

In some embodiments, to facilitate supporting the first horizontal bus 900 on one of the screen(s) 130, 132, 134, 136, 300, the first horizontal bus 900 can include one or more adapters 912 coupled to the body 901. The adapter(s) 912 can be structured and/or configured to couple (e.g., removably couple) the first horizontal bus 900 to one of the screens 130, 132, 134, 136, 300. In some embodiments, the adapter 912 can define an aperture 914 configured to align to a particular portion of a screen. For example, when the aperture 914 of the adapter 912 is aligned to one of the apertures 316 of the screen 300, a fastener can be inserted through the aperture 914 of the adapter 912 and the one of the apertures 316 of the screen 300.

Figure 10:
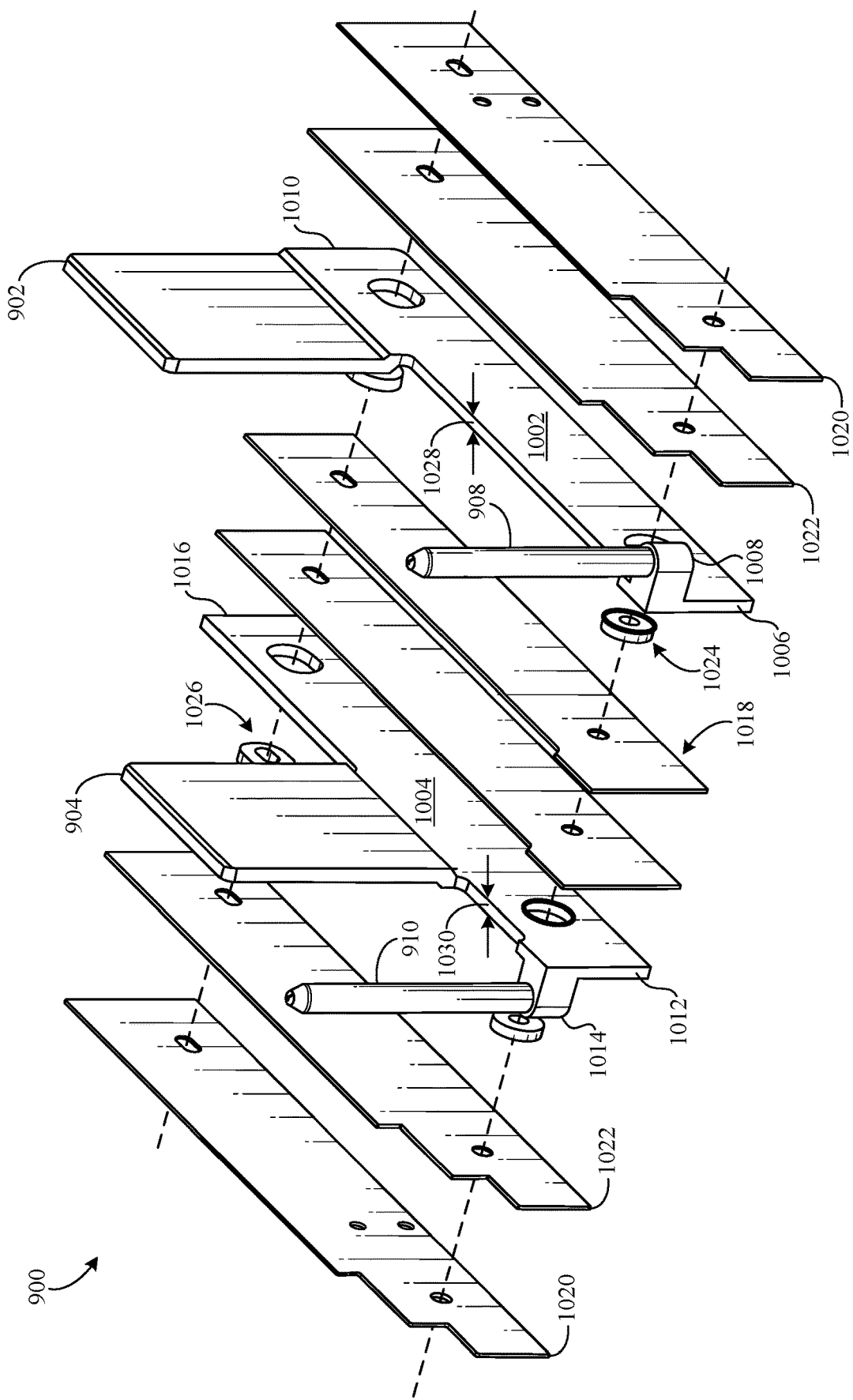
FIG. 10 is an exploded view of the first horizontal bus of FIG. 9.

FIG. 10 is an exploded view of the first horizontal bus 900 of FIG. 9. Notably, according to embodiments of the disclosed subject matter, the first horizontal bus 900 can be comprised of a number of layers, for instance, laminated layers.

According to the illustrated example of FIG. 10, the first horizontal bus 900 can include a first conductive layer 1002 (e.g., copper) and a second conductive layer 1004 (e.g., copper). The first conductive layer 1002 of the first horizontal bus 900 can connects the supply pin 908 to the primary supply projection 902 such that electricity is transmittable through the first conductive layer 1002 between the supply pin 908 and the primary supply projection 902. Further, the second conductive layer 1004 of the first horizontal bus 900 can connect the return pin 910 to the primary return projection 904 such that electricity is transmittable through the second conductive layer 1004 between the return pin 910 and the primary return projection 904.

According to the illustrated example of FIG. 10, the primary supply projection 902 can be coupled to the first conductive layer 1002 of the first horizontal bus 900. For example, as shown in FIG. 10, the primary supply projection 902 and the first conductive layer 1002 of the first horizontal bus 900 can form and/or define an integral or single-piece component. In such embodiments, the primary supply projection 902 and the first conductive layer 1002 of the first horizontal bus 900 can have a same or substantially similar cross-sectional area. Further, the supply pin 908 can be coupled to a portion of the first conductive layer 1002 of the first horizontal bus 900 at or adjacent a first side 1006 of the first conductive layer 1002. For example, the supply pin 908 can extend through a first protrusion 1008 that is formed on the first conductive layer 1002 and projects therefrom in a first direction. As shown in FIG. 10, the primary supply projection 902 can be positioned at or adjacent a second side 1010 of the first conductive layer 1002 opposite the first side 1006.

Additionally, the primary return projection 904 can be coupled to the second conductive layer 1004. For example, as shown in FIG. 10, the primary return projection 904 and the second conductive layer 1004 of the first horizontal bus 900 can form and/or define an integral or single-piece component. In such embodiments, the primary return projection 904 and the second conductive layer 1004 can have a same cross-sectional area. Further, the return pin 910 can be coupled to a portion of the second conductive layer 1004 of the first horizontal bus 900 at or adjacent a first side 1012 of the second conductive layer 1004. For example, the return pin 910 can extend through a second protrusion 1014 that is formed on the second conductive layer 1004 and projects therefrom in a second direction opposite the first direction. As shown in FIG. 10, the primary return projection 904 can be positioned between the first side 1012 of the second conductive layer 1004 and a second side 1016 of the second conductive layer 1004 opposite the first side 1012, for example, such that the primary supply and return projections 902, 904 do not overlap with each other.

In some embodiments, to insulate the first conductive layer 1002 from the second conductive layer 1004, the first horizontal bus 900 can include one or more inner or first insulation layers 1018 interposed between the first conductive layer 1002 and the second conductive layer 1004. When the first horizontal bus 900 is produced, the first insulation layer(s) 1018 can be coupled between the first and second conductive layers 1002, 1004 to provide insulation thereto. As shown in FIG. 10, the first insulation layer(s) 1018 can be sized and/or shaped to substantially cover inner, opposing surfaces of the respective first and second conductive layers 1002, 1004 (i.e., surfaces that face each other).

Additionally, the first horizontal bus 900 can include at least two protective layers 1020 between which the first and second conductive layers 1002, 1004 are positioned. In such embodiments, to provide additional insulation, the first horizontal bus 900 may also include at least two outer or second insulation layers 1022 between which the first and second conductive layers 1002, 1004 are positioned. In such embodiments, the second insulation layers 1022 can be respectively interposed between one of the protective layers 1020 and one of the first or second conductive layers 1002, 1004.

In some embodiments, the first horizontal bus 900 can include first spacers 1024, each of which may be sized and/or shaped to fit within a portion of a respective one of the apertures 916 defined by the first conductive layer 1002. Each of the first spacers 1024 can include an aperture positioned thereon through which a fastener can extend. Similarly, in some embodiments, the first horizontal bus 900 can include second spacers 1026, each of which can be sized and/or shaped to fit within a portion of a respective one of the aperture(s) 916 defined by the second conductive layer 1004.

In some embodiments, the first conductive layer 1002 can be implemented as a plate (e.g., a relatively thick, copper plate). As shown in FIG. 10, the first conductive layer 1002 of the first horizontal bus 900 can have a thickness 1028 that is substantially uniform or slightly varies across the first conductive layer 1002 from the first side 1006 of the first conductive layer 1002 to the second side 1010 of the first conductive layer 702. Similarly, in some embodiments, the second conductive layer 1004 can be implemented as a plate (e.g., a relatively thick, copper plate). As shown in FIG. 10, the second conductive layer 1004 of the first horizontal bus 900 can have a thickness 1030 that is substantially uniform or slightly varies across the second conductive layer 1004 from the first side 1012 of the second conductive layer 1004 to the second side 1016 of the second conductive layer 1004. In some embodiments, the thickness 1030 of the second conductive layer 1004 can be substantially equal to or the same as the thickness 1028 of the first conductive layer 1002.

The conductive layers 1002, 1004 of the first horizontal bus 900 can be constructed of, for example, copper and/or any other suitable conductor. Further, the insulation layers 1018, 1022 of the first horizontal bus 900 can be constructed of, for example, Kapton and/or any other suitable insulator. Further still, the protective layers 1020, the first spacers 724, and/or the second spacers 726 of first horizontal bus 900 can be constructed of, for example, G10 glass epoxy or any other suitable insulator.

Although FIGS. 9 and 10 depict aspects in connection with first horizontal bus 900, in some embodiments, such aspects likewise apply to one or more other primary horizontal buses of the bus bar assembly 104, such as one or more (e.g., all) of the first horizontal buses 110 and/or the third horizontal buses 120. In such embodiments, the first connection interface 162 can include multiple supply pins (e.g., similar to the supply pin 908 of FIGS. 9 and 10) coupled to the first horizontal buses 110. Each of the supply pins can be connected to a respective one of the primary supply projections 146 and insertable in a respective one of the supply sockets 704. Further, in such embodiments, the first connection interface 162 can also include multiple return pins (e.g., similar to the return pin 910 of FIGS. 9 and 10) coupled to the first horizontal buses 110 and positioned adjacent respective ones of the supply pins. Each of the return pins can be connected to a respective one of the primary return tabs or projections 148 and insertable in a respective one of the return sockets 708.

Figure 11:
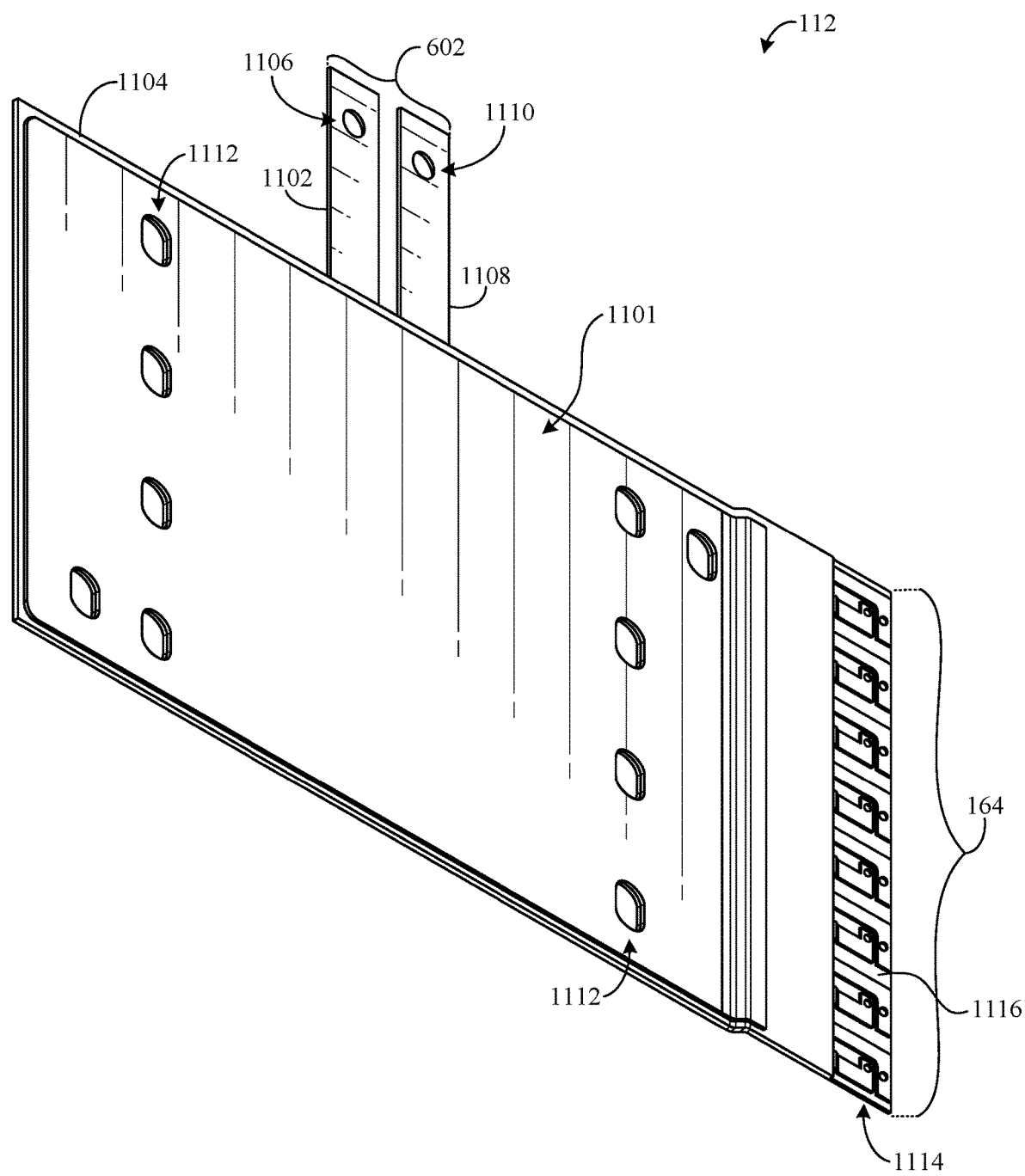
FIG. 11 is a view of a second vertical bus according to one or more embodiments of the disclosed subject matter.

FIG. 11 is a view of a second vertical bus 112 according to embodiments of the disclosed subject matter. In some embodiments, the second horizontal bus 1100 can correspond to at least one of the second horizontal buses 112 of FIGS. 1A, 1B, and 1C and/or at least one of the fourth horizontal buses 124 of FIGS. 1A, 1B, and 1C. As discussed above, the second horizontal bus 112 can define, at least in part, the blind made interface 144. As such, the second horizontal bus 112 can have body 1101 and the third connection interface 602. As noted above, the third connection interface 602 can facilitate electrically coupling the second vertical bus 112 to the power source 102. The third connection interface 602 can be comprised (or consist) of a first projection 1102 (e.g., tab or fin) and a second projection 1108 (e.g., tab or fin), which may be referred to as an auxiliary supply projection and an auxiliary return projection, respectively. As shown in FIG. 11, the first projection 1106 and the second projection 1108 can project from a first side 1104 of the body 1101 and/or otherwise extend away from the first side 1104, for example, along a substantially linear path. In some embodiments, the first projection 1102 and the second projection 1108 can be substantially parallel relative to each other, such as shown in FIG. 11.

In some embodiments, the second vertical bus 112 can include one or more apertures 1110 (one of which is shown in this example) positioned on the second projection 1108, which facilitate electrically coupling the second projection 1108 to the power source 102. Additionally or alternatively, in some embodiments, one or more apertures 1106 can be positioned on the first projection 1102, which may facilitate electrically coupling the first projection 1102 to the power source 102.

In some embodiments, to facilitate supporting the second vertical bus 112 on the second radar support structure 142, the second vertical bus 112 can include one or more apertures 1112 positioned on the body 1101 and extending at least partially (e.g., entirely) through the body 1101. For example, the aperture(s) 1112 of the second vertical bus 112 can be configured to receive the fastener(s) 170 associated with the second radar support structure 142. A pattern formed by the apertures 1112 of the second vertical bus 112 may substantially match a pattern formed by the apertures 614 of the first vertical bus 108. As such, when the second vertical bus 112 is positioned on the second radar support structure 142, each of the fastener(s) 170 can align to and/or extend through a respective one of the aperture(s) 1112 of the second vertical bus 112.

In some embodiments, the second connection interface 164 can include first connection features 1114 (e.g., relatively small supply tabs and return tabs) coupled to the body 1101 of the second vertical bus 112. Each of the first connection features 1114 can be connected to one of the first or second projections 1102, 1108 of the third connection interface 602. In particular, the first connection features 1114 can be configured to receive second connection features (e.g., terminals) associated with the second horizontal buses 114, as discussed further below. As shown in FIG. 11, for instance, the first connection features 1114 can be positioned on or adjacent an insulating portion 1116 (e.g., a plate) of second vertical bus 112, which may press against the first connection features 1114 when the second vertical bus 112 and the second horizontal buses 110 are assembled. The insulating portion 1116 can extend away from the body 1101 beneath the first connection features 1114. In such embodiments, the first connection features 1114 can be distributed along at least portion of a length of the insulating portion 1116. As shown in FIG. 11, for instance, the first connection features 1114 can be distributed along the entire length of the insulating portion 1116.

Figure 12:
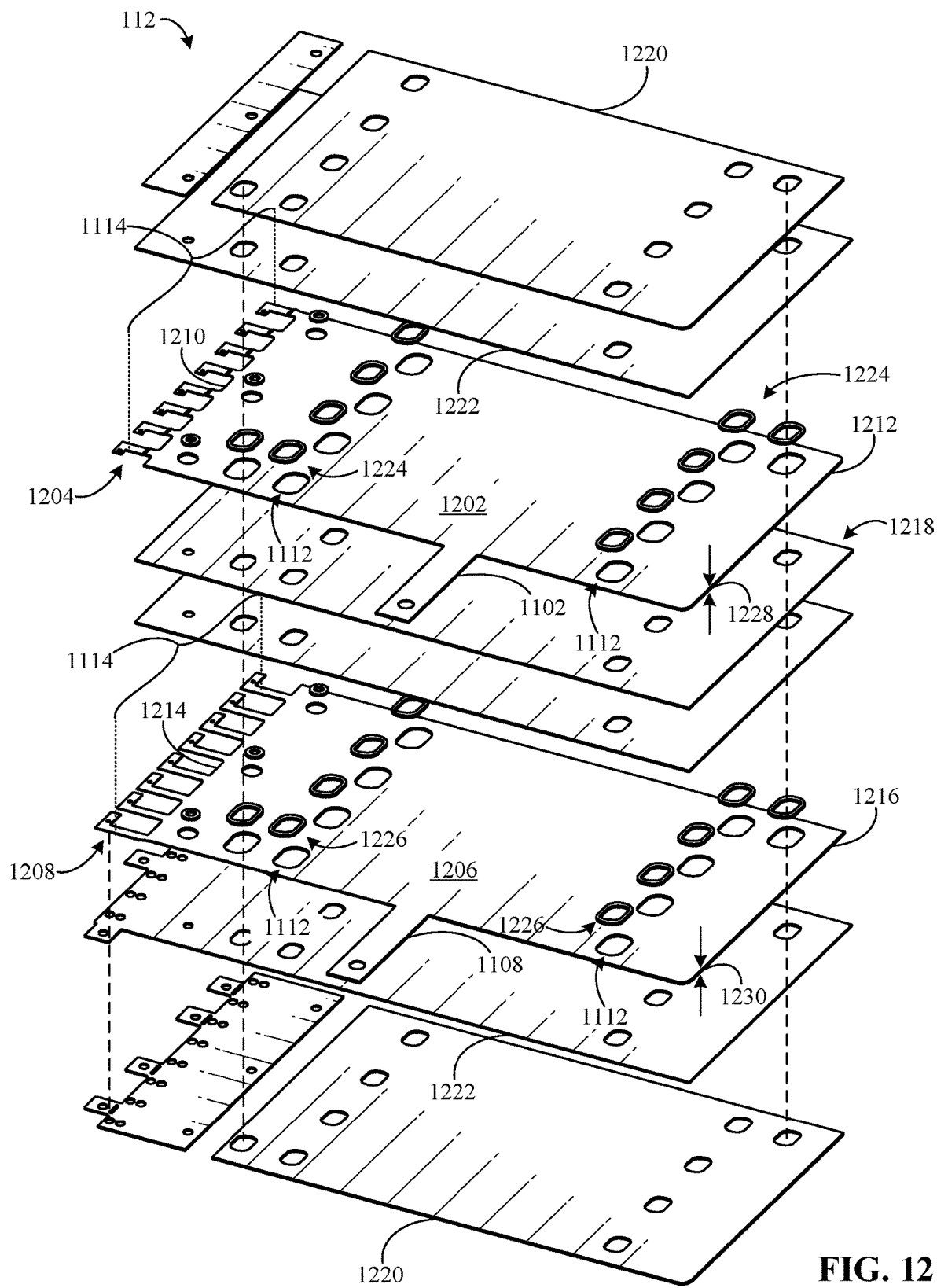
FIG. 12 is an exploded view of the second vertical bus of FIG. 11.

FIG. 12 is an exploded view of the second vertical bus 112 of FIG. 11, and shows layers thereof according to one or more embodiments of the disclosed subject matter. According to the illustrated example of FIG. 12, the second vertical bus 112 can include a first conductive layer 1202 (e.g., copper) and supply connection features 1204 (e.g., relatively small supply tabs) formed on and/or coupled to the first conductive layer 1202. The supply connection features 1204 can correspond to some of the first connection features 1114 of FIG. 11.

The second vertical bus 112 can also include a second conductive layer 1206 (e.g., copper) and return connection features 1208 (e.g., relatively small return tabs) formed on and/or coupled to the second conductive layer 1206. The return connection features 1208 can correspond to some of the first connection features 1114 of FIG. 11. In particular, the first conductive layer 1202 can connect the first projection 1102 of the third connection interface 602 to the supply connection features 1204 such that electricity is transmittable through the first conductive layer 1202 between the first projection 1102 and the supply connection features 1204. Further, the second conductive layer 1206 can connect the second projection 1108 of the third connection interface 602 to the return connection features 1208 such that electricity is transmittable through the second conductive layer 1206 between the second projection 1108 and the return connection features 1208.

According to the illustrated example of FIG. 12, the first projection 1102 of the third connection interface 602 can be coupled to the first conductive layer 1202 of the second vertical bus 112. As shown in FIG. 12, the first projection 1102 and the first conductive layer 1202 of the second vertical bus 112 can form and/or define an integral or single-piece component. In such embodiments, the first projection 1102 and the first conductive layer 1202 can have a same or substantially the same cross-sectional area. Similarly, the second projection 1108 can be coupled to the second conductive layer 1206 of the second vertical bus 112. For example, as shown in FIG. 12, the second projection 1108 and the second conductive layer 1206 of the second vertical bus 112 can form and/or define an integral or single-piece component. In such embodiments, the second projection 1108 and the second conductive layer 1206 can have a same or substantially the same cross-sectional area.

As shown in FIG. 12, the supply connection features 1204 can be distributed at least partially along a first side 1210 of the first conductive layer 1202. Further, as shown in FIG. 12, the first projection 1102 can be positioned between the first side 1210 and a second side 1212 of the first conductive layer 1202 opposite the first side 1210. The return connection features 1208 can also be are distributed, at least partially along a first side 1214 of the second conductive layer 1206. Further, as shown in FIG. 12, the second projection 1108 can be positioned between the first side 1214 a second side 1216 of the second conductive layer 1206 opposite the first side 1214.

To insulate the first conductive layer 1202 from the second conductive layer 1206, the second vertical bus 112 can include one or more inner or first insulation layers 1218 (e.g., dielectric insulation) interposed between the first conductive layer 1202 and the second conductive layer 1206.

When the second vertical bus 112 is produced, the first insulation layer(s) 1218 can be coupled between the first and second conductive layers 1202, 1206 to provide insulation thereto. As shown in FIG. 12, the first insulation layer(s) 1218 of the second vertical bus 112 can be sized and/or shaped to substantially cover inner, opposing surfaces of the respective first and second conductive layers 1202, 1206 (i.e., surfaces that face each other).

In some embodiments, the second vertical bus 112 can include at least two protective layers 1220 between which the first and second conductive layers 1202, 1206 can be positioned. In such embodiments, to provide additional insulation, the second vertical bus 112 may also include at least two outer or second insulation layers 1222 (e.g., dielectric insulation) between which the first and second conductive layers 1202, 1206 can be positioned. In such embodiments, each of the second insulation layers 1222 of the second vertical bus 112 can be interposed between one of the protective layers 1220 and a respective one of the first or second conductive layers 1202, 1206.

Additionally, in some embodiments, the second vertical bus 112 may include spacers 1224, each of which can be sized and/or shaped to fit within a portion of a respective one of the apertures 1112 defined by the first conductive layer 1202. Each of the spacers 1224 of the second vertical bus 112 can include an aperture positioned thereon through which a fastener can extend. Similarly, in some embodiments, the second vertical bus 112 may include spacers 1226, each of which can be sized and/or shaped to fit within a portion of a respective one of the apertures 1112 defined by the second conductive layer 1206. Each of the spacers 1226 may include an aperture positioned thereon through which a fastener can extend.

In some embodiments, the first conductive layer 1202 of the second vertical bus 112 can be implemented as a plate (e.g., a relatively thin, copper plate), which may be referred to as an auxiliary supply plate or a supply plate. As shown in FIG. 12, for instance, the first conductive layer 1202 can have a thickness 1228 that is substantially uniform or slightly varies across the first conductive layer 1202 from the first side 1210 of the first conductive layer 1202 to the second side 1212 of the first conductive layer 1202.

Similarly, in some embodiments, the second conductive layer 1206 of the second vertical bus 112 can be implemented as a plate (e.g., a relatively thin, copper plate), which may be referred to as an auxiliary return plate or a return plate. As shown in FIG. 12, the second conductive layer 1206 can have a thickness 1230 that is substantially uniform or slightly varies across the second conductive layer 1206 from the first side 1214 of the second conductive layer 1206 to the second side 1216 of the second conductive layer 1206. In some embodiments, the thickness 1230 of the second conductive layer 1206 can be substantially equal to or the same as the thickness 1228 of the first conductive layer 1202.

As previously mentioned, in some embodiments, the first vertical bus 108 can have a greater current carrying capacity relative to the second vertical bus 112. For example, during radar operation, the first or second conductive layer 702, 706 of the first vertical bus 108 can have a cross-sectional area through which electricity flows, and the first or second conductive layer 1202, 1206 of the second vertical bus 112 can have a cross-sectional area through which electricity flows. The cross-sectional area associated with the first vertical bus 108 can be greater than the cross-sectional area associated with the second vertical bus 112. Additionally or alternatively, in one or more embodiments, the thickness 728 of the first conductive layer 702 of the first vertical bus 108 can be greater than the thickness 1228 of the first conductive layer 1202 of the second vertical bus 112. Similarly, continuing with this embodiment, the thickness 730 of the second conductive layer 706 of the first vertical bus 108 can be greater than the thickness 1230 of the second conductive layer 1206 of the second vertical bus 112. Additionally or alternatively, in another embodiment, the first and second conductive layers 702, 706 of the first vertical bus 108 can be sized and/or shaped to be generally larger than the respective first and second conductive layers 1202, 1206 of the second vertical bus 112.

The conductive layers 1202, 1206 of the second vertical bus 112 can be constructed of, for example, copper and/or any other suitable conductor. Further, the insulation layers 1218, 1222 of the second vertical bus 112 can be constructed of, for example, Kapton and/or any other suitable insulator. Further still, the protective layers 1220 of the second vertical bus 112 can be constructed of, for example, glass or any other suitable insulator. Further still, the spacers 1224 and/or the spacers 1226 of the second vertical bus 112 can be constructed of, for example, glass or any other suitable insulator.

Although FIGS. 11 and 12 depict aspects in connection with the second vertical bus 112, in some embodiments, such aspects likewise apply to one or more other auxiliary vertical buses of the bus bar assembly 104, such as the fourth vertical bus 122.

Figure 13:
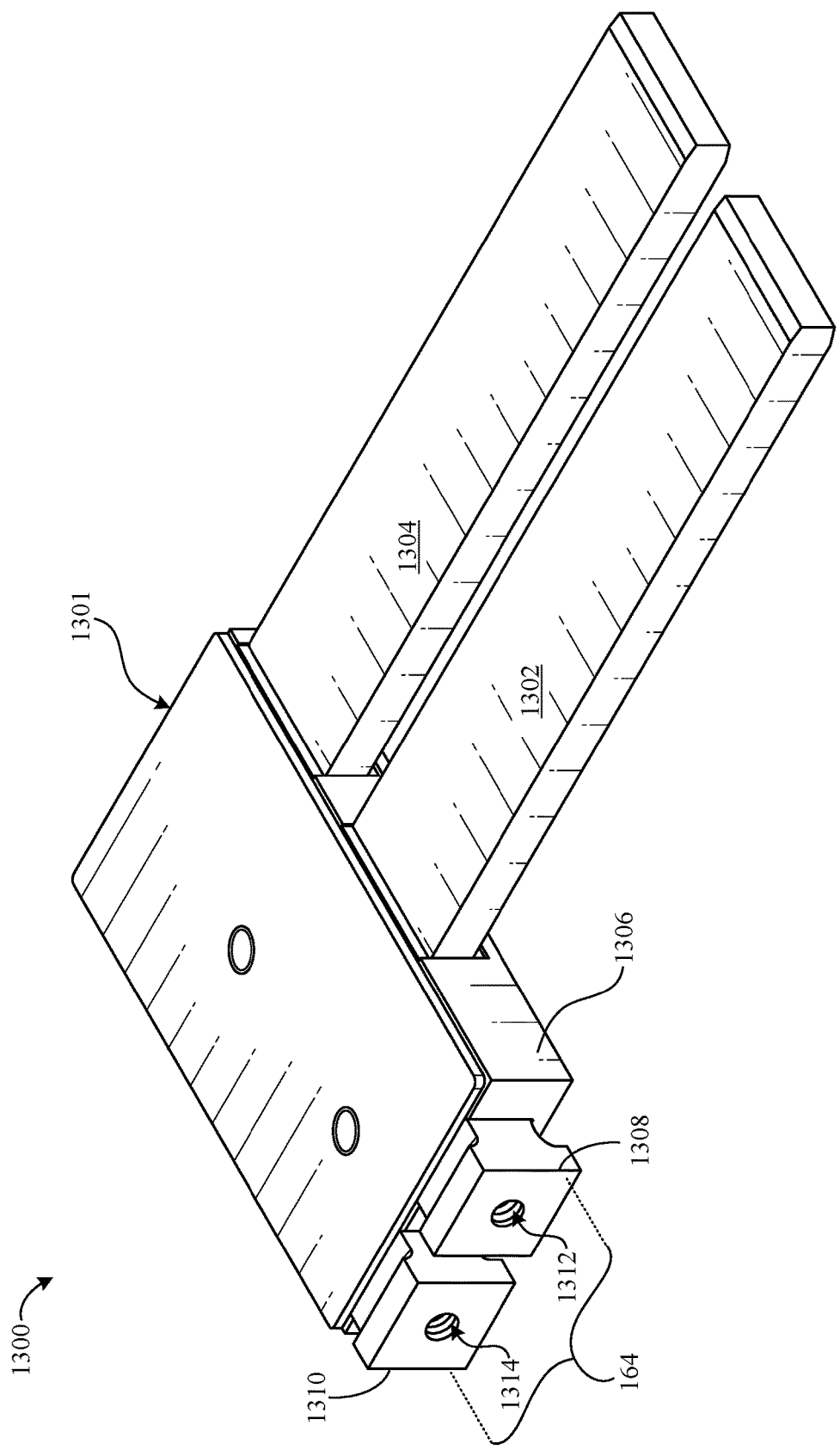
FIG. 13 is a view of a second horizontal bus according to one or more embodiments of the disclosed subject matter.

FIG. 13 is a view of a second horizontal bus 1300 according to embodiments of the disclosed subject matter. In some embodiments, the second horizontal bus 1300 can correspond to at least one of the second horizontal buses 114 of FIGS. 1A, 1B, and 1C and/or at least one of the fourth horizontal buses 124 of FIGS. 1A, 1B, and 1C.

Figure 14:
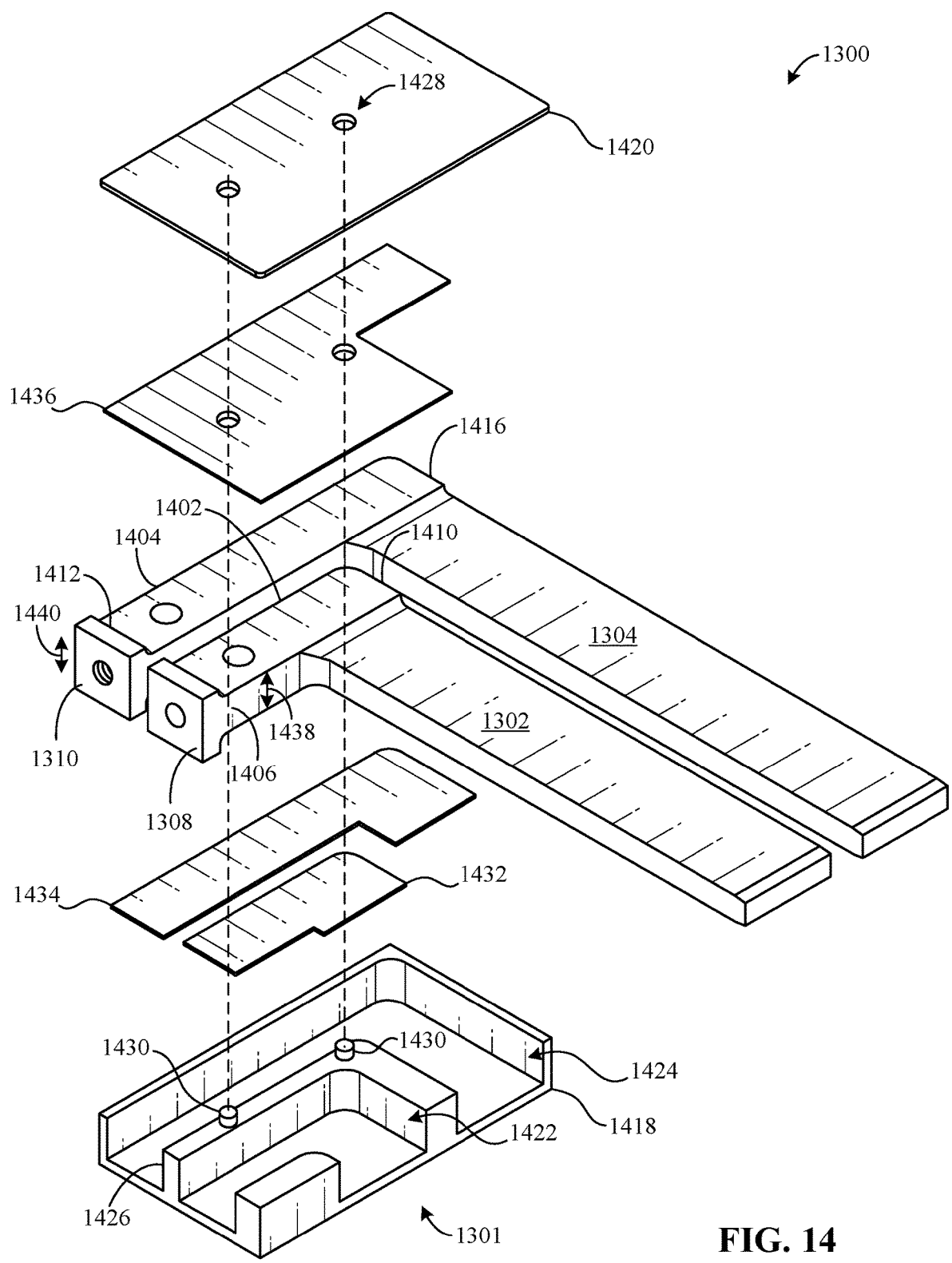
FIG. 14 is an exploded view of the second horizontal bus of FIG. 13.

Second horizontal bus 1300 can have a housing 1301 (e.g., an insulated housing). A first projection 1302 (e.g., tab or fin) and a second projection 1304 (e.g., tab or fin) can be provided. The first and second projections 1302, 1304 may be referred to as auxiliary supply and auxiliary return projections, respectively. The first projection 1302 may correspond to at least one of the auxiliary supply tabs 150, 158 of FIG. 1B, and the second projection 1304 may correspond to at least one of the auxiliary return tabs 152, 160 of FIG. 1B. Each of the first and second projections 1302, 1304 can be coupled to the housing 1301 of second horizontal bus 1300, such as shown in FIG. 14. As shown in FIG. 13, the first projection 1302 can project from a first side 1306 of the housing 1301 and/or otherwise extends away from the first side 1306, for instance, to receive a portion of an LRU. Similarly, the second projection 1304 can project from the first side 1306 and/or otherwise extends away from the first side 1306, for instance, to receive a different portion of the LRU. In some embodiments, the first and second projections 1302, 1304 can extend at least partially into the housing 1301, such as shown in FIG. 14.

The second horizontal bus 1300 can also form the second connection interface 164. According to the illustrated example of FIG. 13, the second connection interface 164 can include first and second terminals, which may be referred to as a supply terminal 1308 and a return terminal 1310, respectively, for an auxiliary vertical bus. The supply terminal 1308 can be formed in one piece with the first projection 1302, and the return terminal 1310 can be formed in one piece with the second projection 1304. The supply terminal 1308 can be configured to directly contact one of the supply connection features 1204, and the return terminal 1310 can be configured to directly contact one of the return connection features 1208 of the second vertical bus 112. In this manner, the second connection interface 164 can electrically couple, for example, (a) the first projection 1302 to the first conductive layer 1202 of the second vertical bus 112 and (b) the second projection 1304 to the second conductive layer 1206 of the second vertical bus 112.

In some embodiments, to facilitate coupling the second horizontal bus 1300 to an auxiliary vertical bus, the supply terminal 1308 may include at least one aperture 1312 (e.g., circular openings) positioned thereon and configured to receive a fastener associated with the second connection interface 164. In such embodiments, the supply terminal 1308 may have a threaded inner surface forming the aperture 1312 that engages the fastener. Similarly, in some embodiments, the return terminal 1310 may include at least one aperture 1314 positioned thereon and configured to receive a fastener associated with the second connection interface 164. In such embodiments, the return terminal 1310 may have a threaded inner surface forming the aperture 1314 that engages the fastener.

FIG. 14 is an exploded view of the second horizontal bus 1300 of FIG. 13. According to the illustrated example of FIG. 14, the second horizontal bus 1300 can include a first conductive layer 1402 (e.g., copper) and a second conductive layer 1404 (e.g., copper) that are insulated from each other. The first conductive layer 1402 of the second horizontal bus 1300 can be formed in one piece with the first projection 1302 and the supply terminal 1308 such that electricity is transmittable through the first conductive layer 1402 between the first projection 1302 and the supply terminal 1308. Further, the second conductive layer 1404 can be formed in one piece with the second projection 1304 and the return terminal 1310 such that electricity is transmittable through the second conductive layer 1404 between the second projection 1304 and the return terminal 1310.

According to the illustrated example of FIG. 14, the first projection 1302 of the blind mate interface 144 can be coupled to the first conductive layer 1402 of the second horizontal bus 1300. For example, as shown in FIG. 14, the first projection 1302 and the first conductive layer 1402 of the second horizontal bus 1300 can form and/or define an integral or single-piece component. In such embodiments, the first projection 1302 and the first conductive layer 1402 of the second horizontal bus 1300 may have a same cross-section area. Further, the supply terminal 1308 can be coupled to a portion of the first conductive layer 1402 of the second horizontal bus 1300 at or adjacent a first end 1406 of the first conductive layer 1402. For example, the supply terminal 1308 and the first conductive layer 1402 can form and/or define an integral or single-piece component. Further, as shown in FIG. 14, the first projection 1302 can be positioned at or adjacent a second end 1410 of the first conductive layer 1402 opposite the first end 1406.

The second projection 1304 of the blind mate interface 144 can be coupled to the second conductive layer 1404. For example, as shown in FIG. 14, the second projection 1304 and the second conductive layer 1404 of the second horizontal bus 1300 can form and/or define an integral or single-piece component. In such embodiments, the second projection 1304 and the second conductive layer 1404 can have a same cross-sectional area. Further, the return terminal 1310 can be coupled to a portion of the second conductive layer 1404 of the second horizontal bus 1300 at or adjacent a first end 1412 of the second conductive layer 1404. For example, the return terminal 1310 and the second conductive layer 1404 can form and/or define an integral or single-piece component. Further, as shown in FIG. 14, the second projection 1304 can be positioned at or adjacent a second end 1416 of the second conductive layer 1404 opposite the first end 1412.

According to the illustrated example of FIG. 14, the housing 1301 of the second horizontal bus 1300 can include a first portion (e.g., a base portion) 1418 and a second portion (e.g., a cover) 1420 configured to couple to the first portion 1418. In some embodiments, to facilitate holding components of the second horizontal bus 1300, the first portion 1418 of the housing 1301 can form and/or define one or more cavities 1422, 1424 (i.e., a first cavity 1422 and a second cavity 1424). In such embodiments, the first cavity 1422 can be sized and/or shaped to receive the first conductive layer 1402 of the second horizontal bus 1300, for example, such that the first conductive layer 1402 extends through the first cavity 1422 from the first projection 1302 to the supply terminal 1308. Further, the second cavity 1424 can be sized and/or shaped to receive the second conductive layer 1404 of the second horizontal bus 1300, for example, such that the second conductive layer 1404 extends through the second cavity 1424 from the second projection 1304 to the return terminal 1310.

In some embodiments, to insulate the first conductive layer 1402 from the second conductive layer 1404, the housing 1301 may include a wall 1426 positioned on the first portion 1418 of the housing 1301. As shown in FIG. 14, the wall 1426 can project from a surface of the housing 1301 and/or extend away from the surface. In particular, when the second horizontal bus 1300 is assembled, the wall 1426 can extend between the first and second conductive layers 1402, 1404 to provide insulation thereto. In some embodiments, to facilitate assembling the housing 1301, the second portion 1420 of the housing 1301 may include one or more apertures 1428 positioned thereon. In particular, each of the aperture(s) 1428 can be configured to receive a protrusion 1430 of the first housing portion 1418.

In some examples, to provide additional insulation, the second horizontal bus 1300 may also include one or more insulation layers 1432, 1434, 1436 (i.e., a first insulation layer 1432, a second insulation layer 1434, and a third insulation layer 1436). The first insulation layer 1432 can be interposed between the first conductive layer 1402 of the second horizontal bus 1300 and the first portion 1418 of the housing 1301 to provide insulation thereto. Further, the second insulation layer 1434 can be interposed between the second conductive layer 1404 of the second horizontal bus 1300 and the first portion 1418 of the housing 1301 to provide insulation thereto. Further still, the third insulation layer 1436 can be interposed between the first and second conductive layers 1402, 1404 and the second portion 1420 of the housing 1301 to provide insulation thereto.

In some embodiments, the first conductive layer 1402 of the second horizontal bus 1300 may have a thickness 1438 that is substantially uniform or slightly varies across the first conductive layer 1402 from the first end 1406 of the first conductive layer 1402 to the second end 1410 of the first conductive layer 1402. Similarly, in some embodiments, the second conductive layer 1404 of the second horizontal bus 1300 may have a thickness 1440 that is substantially uniform or slightly varies across the second conductive layer 1404 from the first end 1412 of the second conductive layer 1404 to the second end 1416 of the second conductive layer 1404. In some embodiments, the thickness 1438 of the second conductive layer 1404 can be substantially equal to or the same as the thickness 1440 of the first conductive layer 1402.

In some embodiments, the first horizontal bus 900 has a greater current carrying capacity relative to the second horizontal bus 1300, as noted above. For example, during radar operation, the first or second conductive layer 1002, 1004 of the first horizontal bus 900 can have a cross-sectional area through which electricity flows, and the first or second conductive layer 1402, 1404 of the second horizontal bus 1300 can have a cross-sectional area through which electricity flows. The cross-sectional area associated with the first horizontal bus 900 can be greater than the cross-sectional area associated with the second horizontal bus 1300. In one embodiment, the thickness 1028 of the first conductive layer 1002 of the first horizontal bus 900 can be greater than the thickness 1438 of the first conductive layer 1402 of the second horizontal bus 1300. Similarly, the thickness 1030 of the second conductive layer 1004 of the first horizontal bus 900 can be greater than the thickness 1440 of the second conductive layer 1404 of the second horizontal bus 1300. Additionally or alternatively, in another embodiment, the first and second conductive layers 1002, 1004 of the first horizontal bus 900 can be sized and/or shaped to be generally larger than the respective first and second conductive layers 1402, 1404 of the second vertical bus 112.

The conductive layers 1402, 1404 of the second horizontal bus 1300 can be constructed of, for example, copper and/or any other suitable conductor. Further, the insulation layers 1432, 1434, 1436 of the second horizontal bus 1300 can be constructed of, for example, Kapton and/or any other suitable insulator. Further still, the first portion 1418 and/or the second portion 1420 of the housing 1301 can be constructed of, for example, glass or any other suitable insulator.

Figure 15:
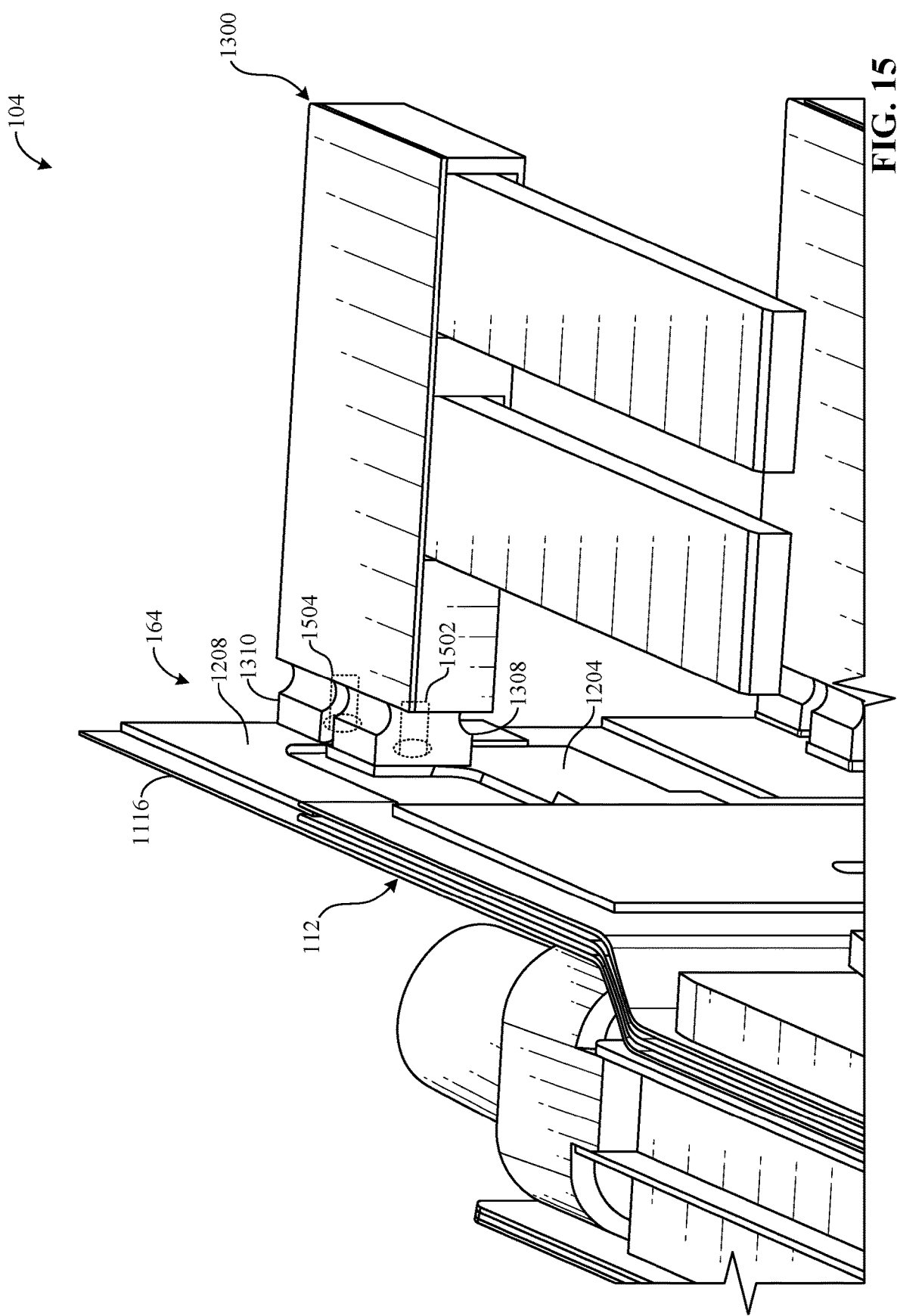
FIG. 15 is an enlarged partial-view of the bus bar assembly of the radar power distribution system of FIG. 1A.

FIG. 15 is an enlarged portion view of the bus bar assembly 104 and shows the second horizontal bus 1300. According to the illustrated example of FIG. 15, the second connection interface 164 can include one or more fasteners 1502 1504 (i.e., a first fastener 1502 and a second fastener 1504) (e.g., screws, etc.), as represented by the dashed lines of FIG. 15. The first fastener 1502 of the second connection interface 164 can extend through the insulating portion 1116 of the second horizontal bus 112 and a first one of the supply connection features 1204. Further, the first fastener 1502 can extend at least partially into the supply terminal 1308. In particular, the first fastener 1502 can urge the first one of the supply connection features 1204 into engagement with the supply terminal 1308 and/or maintain the engagement associated therewith.

Similarly, the second fastener 1504 of the second connection interface 164 can extend through the insulating portion 1116 of the second horizontal bus 112 and a first one of the return connection features 1208. Further, the second fastener 1504 can extend at least partially into the return terminal 1310. As a result, the second fastener 1504 can urge the first one of the return connection features 1208 into engagement with the return terminal 1310 and/or maintain the engagement associated therewith.

Though FIGS. 13-15 depict aspects in connection with the second horizontal bus 1300, in some embodiments, such aspects likewise apply to one or more other horizontal buses of the bus bar assembly 104, such as one or more (e.g., all) of the second horizontal buses 114 and/or the fourth horizontal buses 124. In such embodiments, the second connection interface 164 can include multiple supply terminals (e.g., similar to the supply terminal 1308 of FIGS. 13 and 14) coupled to the second horizontal buses 114. Each of the supply terminals can be connected to a respective one of the auxiliary supply tabs 150 and configured to directly contact a respective one of the supply connection features 1204. Further, in such embodiments, the first connection interface 162 may also include multiple return terminals (e.g., similar to the return terminal 1310 of FIGS. 13 and 14) coupled to the second horizontal buses 114 and positioned adjacent respective ones of the supply terminals. Each of the return terminals can be connected to a respective one of the auxiliary return tabs 152 and configured to directly contact a respective one of the return connection features 1208.

Figure 16:
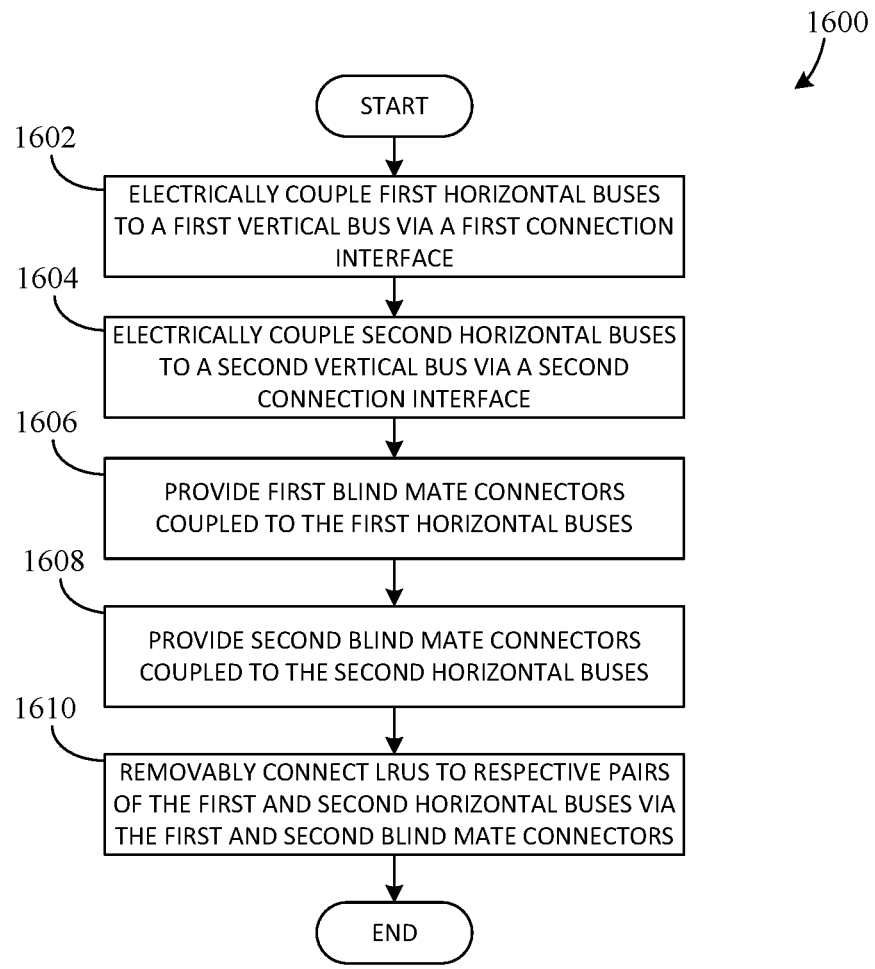
FIG. 16 is a flowchart of an example method according to one or more embodiments of the disclosed subject matter, wherein the operations or steps shown therein may be performed in the shown order or in a different order, including some of the operations or steps being performed at the same time.

FIG. 16 is a flowchart representative of a method 1600 that can be carried out to provide a bus bar assembly for a radar power distribution system according to one or more embodiments of the disclosed subject matter. The example method 1600 can be implemented in the radar power distribution system 100 of FIG. 1A, for instance. Generally speaking, the method 1600 can provide a bus bar assembly (or portions or systems thereof) according to embodiments of the disclosed subject matter, such as the bus bar assembly 104 of FIGS. 1A, 1C, 1B, 2 and 15.

The example method 1600 can include electrically coupling first horizontal buses to a first vertical bus via a first connection interface (block 1602). In some embodiments, the first horizontal buses 110 of FIGS. 1A, 1B, 1C can be electrically coupled to the first vertical bus 108 via the first connection interface 162. For example, the supply and return pins 908, 910 associated with the first horizontal buses 110 can be inserted in into respective ones of the supply and return sockets 704, 708.

The example method 1600 can also include electrically coupling second horizontal buses to a second vertical bus via a second connection interface (block 1604). In some embodiments, the second horizontal buses 114 of FIGS. 1A, 1B, and 1C can be electrically coupled to the second vertical bus 112 via the second connection interface 164. For example, the supply and return terminals 1308, 1310 associated with the second horizontal buses 114 can directly contact respective ones of the supply and return connection features 1204, 1208 (e.g., see FIG. 15).

The example method 1600 of FIG. 16 can also include providing first blind mate connectors coupled to the first horizontal buses (block 1606). In some embodiments, the first and second projections 146, 148 of FIGS. 1B and 2 can be provided, and which can be coupled to the first horizontal buses 110, as previously mentioned.

The example method 1600 of FIG. 16 can also include providing second blind mate connectors coupled to the second horizontal buses (block 1608). In some embodiments, the first and second projections 150, 152 of FIGS. 1B and 2 can be provided, and which can be coupled to the second horizontal buses 114, as previously mentioned.

The example method 1600 of FIG. 16 can also include removably connecting LRUs to respective pairs of the first and second horizontal buses via the first and second blind mate connectors (block 1610). In some embodiments, one or more of the first LRUs 106 can be removably connected to respective pairs of the first and second horizontal buses 110, 114 via first 146, 150 and second projections 148, 152. For example, a pair of the first and second projections 146, 148 and a pair of the first and second projections 150, 152 can receive one of the first LRUs 106.

Although the example method 1600 is described in connection with the flowchart of FIG. 16, other methods of providing the bus bar assembly 104 may alternatively be used. For example, the order of execution of the blocks 1602, 1604, 1606, 1608, 1610 may be changed, and/or some of the blocks 1602, 1604, 1606, 1608, 1610 described may be changed, eliminated, or combined. For instance, blocks 1602 and 1604 can be performed at the same time. Optionally, blocks 1606 and 1608 may be performed as the same time as each other and optionally blocks 1602 and 1604.

Embodiments of the disclosed subject matter may also be as set forth according to the parentheticals in the following paragraphs.

(1) A radar power distribution system, comprising: a chassis; a first laminated vertical bus supported by the chassis and having a vertical orientation in a first vertical plane; a second laminated vertical bus supported by the chassis and separated from the first laminated vertical bus, the second laminated vertical bus having the vertical orientation in a second vertical plane different from the first vertical plane; a plurality of first horizontal buses supported by the chassis and having a horizontal orientation, the first horizontal buses being laminated and spaced from each other vertically; and a plurality of second horizontal buses supported by the chassis and having a horizontal orientation, the second horizontal buses being non-laminated and spaced from each other vertically, wherein the second horizontal buses are horizontally aligned with respective ones of the first horizontal buses, wherein the first and second horizontal buses form, at least in part, blind mate interfaces to removably mate a plurality of line-replaceable units (LRUs) to distribute electrical power from the first and second laminated vertical buses to the LRUs via the first and second horizontal buses, wherein the first laminated vertical bus is configured to provide a first voltage to the first horizontal buses, and wherein the second laminated vertical bus is configured to provide a second voltage less than the first voltage to the second horizontal buses.

(2) The radar power distribution system of (1), wherein each of the first laminated vertical bus and the second laminated vertical bus includes a first planar conductor and a second planar conductor spaced horizontally spaced from each other.

(3) The radar power distribution system of (1) or (2), wherein the first planar conductor is a supply plate for supplying the first or the second voltage, and wherein the second planar conductor is a return plate for the first or the second voltage.

(4) The radar power distribution system of any one of (1) to (3), wherein each of the first and second planar conductors of the first and second laminated vertical buses has a conductive projection, wherein the conductive projections for the first laminated vertical bus extend vertically in a first direction, and wherein the conductive projections for the second laminated vertical bus extend vertically in a second direction opposite the first direction.

(5) The radar power distribution system of any one of (1) to (4), wherein the conductive projections of the first laminated vertical bus are different in width, wherein the conductive projections of the second laminated vertical bus are different in width, and wherein the widths of the conductive projections of the first laminated vertical bus are greater than the widths of the conductive projections of the second laminated vertical bus.

(6) The radar power distribution system of any one of (1) to (5), wherein the first laminated vertical bus is configured to handle a maximum current of 120 A at the first voltage, and wherein the second laminated vertical bus is configured to handle a maximum current of 40 A at the second voltage.

(7) The radar power distribution system of any one of (1) to (6), wherein the first voltage provided by the first laminated vertical bus is a primary voltage for the LRUs and the second voltage provided by the second laminated vertical bus is an auxiliary voltage for the LRUs.

(8) The radar power distribution system of any one of (1) to (7), wherein the first laminated vertical bus is part of a first laminated bus bar assembly supported by the chassis, wherein the second laminated vertical bus bar is part of a second laminated bus bar assembly supported by the chassis, and wherein the first and second horizontal buses are between the first laminated bus bar assembly and the second laminated bus bar assembly in a front elevational view of the radar power distribution system.

(9) The radar power distribution system of any one of (1) to (8), wherein the first laminated vertical bus is configured to supply the first voltage to a first set of LRUs via the first horizontal buses, and wherein the second laminated vertical bus is configured to supply the second voltage to a second set of LRUs different from the first set of LRUs via the second horizontal bus.

(10) The radar power distribution system of any one of (1) to (9), wherein the first laminated vertical bus is electrically coupled to the first horizontal buses via respective pairs of socket interfaces.

(11) The radar power distribution system of any one of (1) to (10), wherein the first laminated vertical bus is closer to the first horizontal buses than to the second horizontal buses, and wherein the second laminated vertical bus is closer to the second horizontal buses than to the first horizontal buses.

(12) The radar power distribution system of any one of (1) to (11), wherein the first and second vertical buses are part of a laminated bus bar assembly supported by the chassis.

(13) The radar power distribution system of any one of (1) to (12), wherein the first vertical bus of the laminated bus bar assembly is electrically connected to the first horizontal bus, wherein the second vertical bus of the laminated bus bar assembly is electrically connected to the second horizontal bus, and wherein the first and second horizontal buses are on opposite sides of the laminated bus bar assembly.

(14) A bus bar assembly for a radar power distribution system comprising: a first conductive plate subassembly having a vertical orientation in a first vertical plane; a second conductive plate subassembly having the vertical orientation in a second vertical plane different from the first vertical plane, the second conductive plate subassembly being separated in a horizontal direction from the first conductive plate subassembly; a first horizontal bus having a horizontal orientation; and a second horizontal bus having the horizontal orientation and provided at a same height as the first horizontal bus, wherein the first horizontal bus forms, in part, a first blind mate interface to removably connect a first set of line-replaceable units (LRUs) to supply electrical power from the first conductive plate subassembly to the first set of LRUs via the first horizontal bus, wherein the second horizontal bus forms, in part, a second blind mate interface to removably connect a second set of LRUs to supply electrical power from the second conductive plate subassembly to the second set of LRUs via the second horizontal bus, wherein the first conductive plate subassembly is electrically connected to the first horizontal bus and configured to provide a first current to the first horizontal bus, and wherein the second conductive plate subassembly is electrically connected to the second horizontal bus and configured to provide a second current to the second horizontal bus, the second current being less than the first current.

(15) The bus bar assembly of (14), wherein the first conductive plate subassembly is a first laminated vertical bus and the second conductive plate subassembly is a second laminated vertical bus, and wherein each of the first and second laminated vertical buses has a first planar conductor and a second planar conductor spaced horizontally spaced from each other, wherein each of the first and second planar conductors of the first and second laminated vertical buses has a conductive projection, wherein the conductive projections for the first laminated vertical bus extend vertically in a first direction, wherein the conductive projections for the second laminated vertical bus extend vertically in a second direction opposite the first direction, and wherein widths of the conductive projections of the first laminated vertical bus are greater than widths of the conductive projections of the second laminated vertical bus.

(16) The bus bar assembly of (14) or (15), wherein the first conductive plate subassembly is electrically coupled to the first horizontal bus via a pair of socket interfaces.

(17) The bus bar assembly of any one of (14) to (16), wherein the first conductive plate subassembly and the second conductive plate subassembly are part of a laminated vertical bus bar assembly.

(18) A method comprising: providing a first laminated vertical bus having a vertical orientation in a first vertical plane; providing a second laminated vertical bus separated from the first laminated vertical bus and having the vertical orientation in a second vertical plane different from the first vertical plane; providing at least one first horizontal bus having a horizontal orientation; and providing at least one second horizontal bus having a horizontal orientation, wherein the at least one second horizontal bus is horizontally aligned with respective ones of the at least one first horizontal bus, wherein the at least one first and second horizontal buses form, at least in part, blind mate interfaces to removably connect a plurality of line-replaceable units (LRUs) to distribute electrical power from the first and second laminated vertical buses to the LRUs via the at least one first and second horizontal buses, wherein the first laminated vertical bus is electrically connected to the at least one first horizontal bus, wherein the second laminated vertical bus is electrically connected to the at least one second horizontal bus, wherein the first laminated vertical bus is configured to provide a first voltage to the at least one first horizontal bus, and wherein the second laminated vertical bus is configured to provide a second voltage less than the first voltage to the at least one second horizontal bus.

(19) The method of (18), wherein each of the first and second laminated vertical buses has a first planar conductor and a second planar conductor spaced horizontally spaced from each other, wherein each of the first and second planar conductors of the first and second laminated vertical buses has a conductive projection, wherein the conductive projections for the first laminated vertical bus extend vertically in a first direction, wherein the conductive projections for the second laminated vertical bus extend vertically in a second direction opposite the first direction, and wherein widths of the conductive projections of the first laminated vertical bus are greater than widths of the conductive projections of the second laminated vertical bus.

(20) The method of (18) or (19), further comprising removably connecting the LRUs to the blind mate interfaces to electrically connect the LRUs to the first laminated vertical bus via the at least one first horizontal bus and to the second laminated vertical bus via the at least one second horizontal bus.

(21) A radar power distribution system, comprising: a first radar support structure; a second radar support structure spaced from the first radar support structure; a first aperture screen configured to receive a radiating element; a bus bar assembly that is supported by the first radar support structure, the second radar support structure, and the first aperture screen, the bus bar assembly configured to distribute electrical power to first line-replaceable units (LRUs) associated with radar functionality, the bus bar assembly including: a first vertical bus positioned on the first radar support structure and having a vertical orientation; first horizontal buses each of which is connected between the first vertical bus and a respective one of the first LRUs, each of the first horizontal buses positioned on the first aperture screen and having a horizontal orientation; a second vertical bus positioned on the second radar support structure and having a vertical orientation; second horizontal buses each of which is connected between the second vertical bus and a respective one of the first LRUs, each of the second horizontal buses positioned on the first aperture screen and having a horizontal orientation; and a blind mate interface at least partially formed by the first and second horizontal buses, the blind mate interface configured to removably connect each of the first LRUs to a corresponding pair of the first and second horizontal busses, the blind mate interface including: primary supply tabs each of which is coupled to a respective one of the first horizontal buses, primary return tabs each of which is coupled to a respective one of the first horizontal busses and positioned adjacent one of the primary supply tabs, auxiliary supply tabs each of which is coupled to a respective one of the second horizontal buses, and auxiliary return tabs each of which is coupled to a respective one of the second horizontal buses and positioned adjacent one of the auxiliary supply tabs, wherein: each of the first LRUs is configured to receive a first voltage and a second voltage, separate from the first voltage, to power a circuit card thereon, the first vertical bus and the first horizontal buses, together, are configured to transmit electricity at the first voltage from a power source to all of the first LRUs, the second vertical bus and the second horizontal buses, together, are configured to transmit electricity at the second voltage from the power source to all of the first LRUs, and the primary supply tabs, the primary return tabs, the auxiliary supply tabs, and the auxiliary return tabs are insertable in respective ones of the first LRUs to support the respective ones of the first LRUs and supply the electrical power thereto.

(22) The radar power distribution system of (21), further including: a third radar support structure supporting a portion of the bus bar assembly; and a second aperture screen adjacent the first aperture screen and supporting a portion of the bus bar assembly, wherein: the bus bar assembly is configured to distribute the electrical power to second LRUs different from the first LRUs, the bus bar assembly further includes: a third vertical bus positioned on the third radar support structure and having a vertical orientation; third horizontal buses each of which is connected between the third vertical bus and a respective one of the second LRUs, each of the third horizontal buses positioned on the second aperture screen and having a horizontal orientation; a fourth vertical bus positioned on the first radar support structure and having a vertical orientation; and fourth horizontal buses each of which is connected between the fourth vertical bus and a respective one of the second LRUs, each of the fourth horizontal buses positioned on the second aperture screen and having a horizontal orientation, each of the second LRUs is configured to receive the first and second voltages to power a circuit card thereon, the third vertical bus and the third horizontal buses, together, are configured to transmit electricity at the first voltage from the power source to all of the second LRUs, the fourth vertical bus and the fourth horizontal buses, together, are configured to transmit electricity at the second voltage from the power source to all of the second LRUs, and the blind mate interface is at least partially formed by the third and fourth horizontal buses and configured to removably connect each of the second LRUs to a corresponding pair of the third and fourth horizontal busses.

(23) The radar power distribution system of (21) or (22), wherein first vertical bus and the fourth vertical bus are coupled together.

(24) The radar power distribution system of any one of (21) to (23), wherein the bus bar assembly includes a thermal material interposed between the first vertical bus and the fourth vertical bus.

(25) The radar power distribution system of any one of (21) to (24), wherein the first horizontal buses and the second horizontal buses are disposed between the first vertical bus and the second vertical bus.

(26) The radar power distribution system of any one of (21) to (25), wherein: each of the first horizontal buses is configured to carry a first current, and each of the second horizontal buses is configured to carry a second current less than the first current.

(27) The radar power distribution system of any one of (21) to (26), wherein a maximum value corresponding to the first current is about 120 amps and a maximum value corresponding to the second current is about 40 amps.

(28) The radar power distribution system of any one of (21) to (27), wherein: the first vertical bus includes a primary supply plate having a thickness that is greater than a thickness of an auxiliary supply plate of the second vertical bus, and the first vertical bus includes a primary return plate having a thickness that is greater than a thickness of an auxiliary return plate of the second vertical bus.

(29) The radar power distribution system of any one of (21) to (28), wherein the bus bar assembly includes a first connection interface configured to electrically couple (a) each of the primary supply tabs to the primary supply plate and (b) each of the primary return tabs to the primary return plate.

(30) The radar power distribution system of any one of (21) to (29), wherein the first connection interface includes: supply sockets distributed along a side of the primary supply plate, supply pins coupled to the first horizontal buses, each of the supply pins connected to one of the primary supply tabs and insertable in one of the supply sockets, return sockets distributed along a side of the primary return plate adjacent the supply sockets, and return pins coupled to the first horizontal buses, each the return pins connected to one of the primary return tabs and insertable in one of the return sockets.

(31) The radar power distribution system of any one of (21) to (30), wherein the bus bar assembly includes a second connection interface configured to electrically couple (a) each of the auxiliary supply tabs to the auxiliary supply plate and (b) each of the auxiliary return tabs to the auxiliary return plate.

(32) The radar power distribution system of any one of (21) to (31), wherein the second connection interface includes: supply connection features distributed along a side of the auxiliary supply plate, supply terminals coupled to the second horizontal buses, each of the supply terminals connected to one of the auxiliary supply tabs and configured to directly contact one of the supply connection features, return connection features distributed along a side of the auxiliary return plate adjacent the supply connection features, and return terminals coupled to the second horizontal buses, each the return terminals connected to one of the auxiliary return tabs and configured to directly contact one of the return connection features.

(33) The radar power distribution system of any one of (21) to (32), wherein each of the second horizontal buses includes an insulated housing in which a first conductive layer and a second conductive layer are positioned, the first conductive layer extending through the insulated housing from one of the auxiliary supply tabs to one of the supply terminal, the second conductive layer extending through the insulated housing from one of the auxiliary return tabs to one of the return terminals.

(34) The radar power distribution system of any one of (21) to (33), wherein each of the first vertical bus, the second vertical bus, the first horizontal buses, and the second horizontal buses is laminated.

(35) The radar power distribution system of any one of (21) to (34), wherein: the first horizontal buses are positioned at or proximate to a side of the first vertical bus and distributed at least partially along a length of the side of the first vertical bus, and the second horizontal busses are positioned at or proximate to a side of the second vertical bus and distributed at least partially along the length of the side of the second vertical bus.

(36) The radar power distribution system of any one of (21) to (35), wherein the first horizontal buses are aligned to the second horizontal buses whereby each of the first horizontal buses and a respective one of the second horizontal buses, together, are substantially positioned on a same horizontal axis.

(37) A bus bar assembly for a radar power distribution system, comprising: a first vertical bus; first horizontal buses electrically coupled to the first vertical bus, the first vertical bus and the first horizontal buses, together, configured to transmit electricity at a first voltage from a power source to LRUs associated with radar functionality; a second vertical bus; second horizontal buses electrically coupled to the second vertical bus, the second vertical bus and the second horizontal buses, together, configured to transmit electricity at a second voltage from the power source to the LRUs; first blind mate connectors coupled to the first horizontal buses whereby each of the first horizontal buses includes a pair of the first blind mate connectors configured to removably connect to one of the LRUs; and second blind mate connectors coupled to the second horizontal busses whereby each of the second horizontal buses includes a pair of the second blind mate connectors configured to removably connect to one of the LRUs.

(38) The bus bar assembly of claim (37), wherein: the first vertical bus and the first horizontal buses form a vertical-to-horizontal configuration in which each of the first horizontal buses is perpendicular relative to the first vertical bus, and the second vertical bus and the second horizontal buses form a vertical-to-horizontal configuration in which each of the second horizontal buses is perpendicular relative to the second vertical bus.

(39) A method to provide a bus bar assembly for a radar power distribution system, comprising: electrically coupling first horizontal buses to a first vertical bus, the first vertical bus and the first horizontal buses, together, configured to transmit electricity at a first voltage from a power source to LRUs associated with radar functionality; electrically coupling second horizontal buses to a second vertical bus, the second vertical bus and the second horizontal buses, together, configured to transmit electricity at a second voltage from the power source to the LRUs; providing first blind mate connectors coupled to the first horizontal buses whereby each of the first horizontal buses includes a pair of the first blind mate connectors configured to removably connect to one of the LRUs; and providing second blind mate connectors coupled to the second horizontal busses whereby each of the second horizontal buses includes a pair of the second blind mate connectors configured to removably connect to one of the LRUs.

(40) The method of (39), further including inserting one of the pairs of blind mate connectors in one of the LRUs.

Having now described embodiments of the disclosed subject matter, it should be apparent to those skilled in the art that the foregoing is merely illustrative and not limiting, having been presented by way of example only. Thus, although particular configurations have been discussed and illustrated herein, other configurations can be and are also employed. Further, numerous modifications and other embodiments (e.g., combinations, rearrangements, etc.) are enabled by the present disclosure and are contemplated as falling within the scope of the disclosed subject matter and any equivalents thereto. Features of the disclosed embodiments can be combined, rearranged, omitted, etc., within the scope of described subject matter to produce additional embodiments. Furthermore, certain features may sometimes be used to advantage without a corresponding use of other features. Accordingly, Applicant intends to embrace all such alternatives, modifications, equivalents, and variations that are within the spirit and scope of the present disclosure. Further, it is therefore to be understood that within the scope of the appended claims, the disclosure may be practiced otherwise than as specifically described herein.

What is claimed is:

1. A radar power distribution system, comprising:
a chassis;
a first laminated vertical bus supported by the chassis and having a vertical orientation in a first vertical plane;
a second laminated vertical bus supported by the chassis and separated from the first laminated vertical bus, the second laminated vertical bus having the vertical orientation in a second vertical plane different from the first vertical plane;
a plurality of first horizontal buses supported by the chassis and having a horizontal orientation, the first horizontal buses being laminated and spaced from each other vertically; and
a plurality of second horizontal buses supported by the chassis and having a horizontal orientation, the second horizontal buses being non-laminated and spaced from each other vertically,
wherein the second horizontal buses are horizontally aligned with respective ones of the first horizontal buses, wherein the first and second horizontal buses form, at least in part, blind mate interfaces to removably connect a plurality of line-replaceable units (LRUs) to distribute electrical power from the first and second laminated vertical buses to the LRUs via the first and second horizontal buses,
wherein the first laminated vertical bus is configured to provide a first voltage to the first horizontal buses, and
wherein the second laminated vertical bus is configured to provide a second voltage less than the first voltage to the second horizontal buses.

2. The radar power distribution system of claim 1, wherein each of the first laminated vertical bus and the second laminated vertical bus includes a first planar conductor and a second planar conductor spaced horizontally from each other.

3. The radar power distribution system of claim 2, wherein the first planar conductor is a supply plate for supplying the first or the second voltage, and wherein the second planar conductor is a return plate for the first or the second voltage.

4. The radar power distribution system of claim 2, wherein each of the first and second planar conductors of the first and second laminated vertical buses has a conductive projection, wherein the conductive projections for the first laminated vertical bus extend vertically in a first direction, and wherein the conductive projections for the second laminated vertical bus extend vertically in a second direction opposite the first direction.

5. The radar power distribution system of claim 4, wherein the conductive projections of the first laminated vertical bus are different in width, wherein the conductive projections of the second laminated vertical bus are different in width, and wherein the widths of the conductive projections of the first laminated vertical bus are greater than the widths of the conductive projections of the second laminated vertical bus.

6. The radar power distribution system of claim 1, wherein the first laminated vertical bus is configured to handle a maximum current of 120 A at the first voltage, and wherein the second laminated vertical bus is configured to handle a maximum current of 40 A at the second voltage.

7. The radar power distribution system of claim 1, wherein the first voltage provided by the first laminated vertical bus is a primary voltage for the LRUs and the second voltage provided by the second laminated vertical bus is an auxiliary voltage for the LRUs.

8. The radar power distribution system of claim 1, wherein the first laminated vertical bus is part of a first laminated bus bar assembly supported by the chassis, wherein the second laminated vertical bus bar is part of a second laminated bus bar assembly supported by the chassis, and wherein the first and second horizontal buses are between the first laminated bus bar assembly and the second laminated bus bar assembly in a front elevational view of the radar power distribution system.

9. The radar power distribution system of claim 1, wherein the first laminated vertical bus is configured to supply the first voltage to a first set of LRUs via the first horizontal buses, and wherein the second laminated vertical bus is configured to supply the second voltage to a second set of LRUs different from the first set of LRUs via the second horizontal bus.

10. The radar power distribution system of claim 1, wherein the first laminated vertical bus is electrically coupled to the first horizontal buses via respective pairs of socket interfaces.

11. The radar power distribution system of claim 1, wherein the first laminated vertical bus is closer to the first horizontal buses than to the second horizontal buses, and wherein the second laminated vertical bus is closer to the second horizontal buses than to the first horizontal buses.

12. The radar power distribution system of claim 1, wherein the first and second vertical buses are part of a laminated bus bar assembly supported by the chassis.

13. The radar power distribution system of claim 12, wherein the first vertical bus of the laminated bus bar assembly is electrically connected to the first horizontal bus, wherein the second vertical bus of the laminated bus bar assembly is electrically connected to the second horizontal bus, and wherein the first and second horizontal buses are on opposite sides of the laminated bus bar assembly.

14. A bus bar assembly for a radar power distribution system comprising:
- a first conductive plate subassembly having a vertical orientation in a first vertical plane;
- a second conductive plate subassembly having the vertical orientation in a second vertical plane different from the first vertical plane, the second conductive plate subassembly being separated in a horizontal direction from the first conductive plate subassembly;
- a first horizontal bus having a horizontal orientation; and
- a second horizontal bus having the horizontal orientation and provided at a same height as the first horizontal bus,
- wherein the first horizontal bus forms, in part, a first blind mate interface to removably connect a first set of line-replaceable units (LRUs) to supply electrical power from the first conductive plate subassembly to the first set of LRUs via the first horizontal bus,
- wherein the second horizontal bus forms, in part, a second blind mate interface to removably connect a second set of LRUs to supply electrical power from the second conductive plate subassembly to the second set of LRUs via the second horizontal bus,
- wherein the first conductive plate subassembly is electrically connected to the first horizontal bus and configured to provide a first current to the first horizontal bus, and
- wherein the second conductive plate subassembly is electrically connected to the second horizontal bus and configured to provide a second current to the second horizontal bus, the second current being less than the first current.

15. The bus bar assembly of claim 14, wherein the first conductive plate subassembly is a first laminated vertical bus and the second conductive plate subassembly is a second laminated vertical bus, and wherein each of the first and second laminated vertical buses has a first planar conductor and a second planar conductor spaced horizontally spaced from each other, wherein each of the first and second planar conductors of the first and second laminated vertical buses has a conductive projection, wherein the conductive projections for the first laminated vertical bus extend vertically in a first direction, wherein the conductive projections for the second laminated vertical bus extend vertically in a second direction opposite the first direction, and wherein widths of the conductive projections of the first laminated vertical bus are greater than widths of the conductive projections of the second laminated vertical bus.

16. The bus bar assembly of claim 14, wherein the first conductive plate subassembly is electrically coupled to the first horizontal bus via a pair of socket interfaces.

17. The bus bar assembly of claim 14, wherein the first conductive plate subassembly and the second conductive plate subassembly are part of a laminated vertical bus bar assembly.

18. A method comprising:
- providing a first laminated vertical bus having a vertical orientation in a first vertical plane;
- providing a second laminated vertical bus separated from the first laminated vertical bus and having the vertical orientation in a second vertical plane different from the first vertical plane;
- providing at least one first horizontal bus having a horizontal orientation; and
- providing at least one second horizontal bus having a horizontal orientation,
- wherein the at least one second horizontal bus is horizontally aligned with respective ones of the at least one first horizontal bus,
- wherein the at least one first and second horizontal buses form, at least in part, blind mate interfaces to removably connect a plurality of line-replaceable units (LRUs) to distribute electrical power from the first and second laminated vertical buses to the LRUs via the at least one first and second horizontal buses,
- wherein the first laminated vertical bus is electrically connected to the at least one first horizontal bus,
- wherein the second laminated vertical bus is electrically connected to the at least one second horizontal bus,
- wherein the first laminated vertical bus is configured to provide a first voltage to the at least one first horizontal bus, and
- wherein the second laminated vertical bus is configured to provide a second voltage less than the first voltage to the at least one second horizontal bus.

19. The method of claim 18, wherein each of the first and second laminated vertical buses has a first planar conductor and a second planar conductor spaced horizontally from each other, wherein each of the first and second planar conductors of the first and second laminated vertical buses has a conductive projection, wherein the conductive projections for the first laminated vertical bus extend vertically in a first direction, wherein the conductive projections for the second laminated vertical bus extend vertically in a second direction opposite the first direction, and wherein widths of the conductive projections of the first laminated vertical bus are greater than widths of the conductive projections of the second laminated vertical bus.

20. The method of claim 18, further comprising removably connecting the LRUs to the blind mate interfaces to electrically connect the LRUs to the first laminated vertical bus via the at least one first horizontal bus and to the second laminated vertical bus via the at least one second horizontal bus.

* * * * *